(12) United States Patent
Hirabayashi

(10) Patent No.: US 9,142,869 B2
(45) Date of Patent: Sep. 22, 2015

(54) DIFFERENTIAL SIGNAL TRANSMISSION LINE

(71) Applicant: ANRITSU CORPORATION, Kanagawa (JP)

(72) Inventor: Fumihito Hirabayashi, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 184 days.

(21) Appl. No.: 13/955,739

(22) Filed: Jul. 31, 2013

(65) Prior Publication Data

US 2014/0035701 A1 Feb. 6, 2014

(30) Foreign Application Priority Data

Aug. 3, 2012 (JP) ................. 2012-172588
Jun. 11, 2013 (JP) ................. 2013-122556

(51) Int. Cl.
  *H01P 5/12* (2006.01)
  *H01P 1/00* (2006.01)
  *H01P 3/02* (2006.01)
  *H03F 3/45* (2006.01)
  *H03F 3/60* (2006.01)

(52) U.S. Cl.
  CPC ...... *H01P 1/00* (2013.01); *H01P 3/026* (2013.01); *H03F 3/45475* (2013.01); *H03F 3/602* (2013.01)

(58) Field of Classification Search
  USPC .............. 333/136, 4, 5, 124–129, 132, 134
  See application file for complete search history.

(56) References Cited

U.S. PATENT DOCUMENTS 4,947,144 A * 8/1990 Le Nohaic .................. 333/128

FOREIGN PATENT DOCUMENTS

| JP | 2882266 B | 8/1995 |
| JP | 3293091 B | 8/1998 |
| JP | 2006-054765 | 2/2006 |

* cited by examiner

*Primary Examiner* — Robert Pascal
*Assistant Examiner* — Kimberly Glenn
(74) *Attorney, Agent, or Firm* — Pearne & Gordon LLP

(57) ABSTRACT

A differential terminal 21a is connected to a branch line 33a which is provided in the main line close to the differential terminal 21a in the range from the intersection portion 39a to a start terminal on the line. A differential terminal 21b is connected to a branch line 37a which is provided in the main line close to the differential terminal 21b in the range from the intersection portion 39a to an end terminal on the line. A differential terminal 22a is connected to a branch line 33b which is provided in the main line close to the differential terminal 22a in the range from the intersection portion 39b to the start terminal. A differential terminal 22b is connected to a branch line 37b which is provided in the main line close to the differential terminal 22b in the range from the intersection portion 39b to the end terminal.

19 Claims, 17 Drawing Sheets

Main line 31 (31a~31d, 31m)
Main line 35 (35a~35d, 35m)

Electric field E (Micro strip type)
Electric field (Balanced type)

Main line 31 (31a~31d, 31m)
Main line 35 (35a~35d, 35m)

DIFFERENTIAL SIGNAL TRANSMISSION LINE

TECHNICAL FIELD

The present invention relates to a technique which solves the problems of unbalanced phase shifts or deterioration of return loss of differential signal transmission due to a difference between the lengths of conductors for connecting a main line and differential terminals and suppress the disturbance for differential signal transmission caused by external electromagnetic noise in a differential signal transmission line that is formed on a substrate together with a plurality of differential circuits, each having a pair of differential terminals for inputting and outputting differential signals, and transmits and receives the differential signals to and from the plurality of differential circuits.

BACKGROUND ART

In a circuit which amplifies or latches a broadband high-frequency signal, in many cases, differential signals including a pair of signals Vin(+) and Vin(−) whose poralities are inverted each other are used. A differential circuit which amplifies or latches the differential signals includes differential input terminals or differential output terminals as a pair of differential terminals.

As such, when the differential circuit which transmit or receive the differential signals is formed on a semiconductor substrate by an integrated circuit (IC) technique, a differential distributed amplifier or a distributed logic circuit has been proposed as a method for obtaining broadband characteristics (Patent Documents 1 and 2).

These circuits have a structure in which the input and output terminals of a plurality of differential circuits that are arranged at regular intervals are connected in series to each other by a transmission line with high characteristic impedance. An artificial transmission line with a high cutoff frequency is formed by the input and output capacitances of the differential circuits and the inductance component of the transmission line. Therefore, it is possible to transmit the differential signals to a plurality of differential circuits in a wide band.

FIG. 16 is a diagram schematically illustrating an example of the layout of a differential distributed amplifier which is formed on a semiconductor substrate, in which a plurality of (in this example, four) differential amplifier circuits 1(1) to 1(4) are arranged in a line at predetermined intervals along the X-axis on a semiconductor substrate (not shown) made of, for example, InP (indium phosphorus) or GaAs (gallium arsenic), with the input and output terminals of all circuits aligned in the same direction. A differential signal transmission line 10 for inputting a signal to a differential amplifier circuit is formed along the X-axis so as to face a pair of differential input terminals 1a and 1b of each differential amplifier circuit and a differential signal transmission line 90 for outputting a signal from the differential amplifier circuit is formed along the X-axis so as to face a pair of differential output terminals 1c and 1d of each differential amplifier circuit.

The differential signal transmission line 10 includes a pair of main lines 11 and 15 which extend in parallel along the X-axis with a predetermined gap G therebetween. The main line 11 includes main line conductors 11b to 11f which are connected in series to each other and the main line 15 includes main line conductors 15b to 15f which are connected in series to each other. The main line conductor is a strip-shaped conductor (formed from metallic, e.g. gold alloy) whose characteristic impedance is arbitrarily set and is represented by a rectangle. A line connecting the main line conductors indicates the connection between the main line conductors. In addition, a branch point of the line is represented by a black circle and a terminal is represented by a white circle.

Differential signals Vin(+) and Vin(−) which are input to start terminals 11a and 15a of the main lines 11 and 15 are absorbed by termination resistors 14 and 18 connected to end terminals 11g and 15g of the main lines 11 and 15. The main lines 11 and 15 are connected to the differential input terminals 1a and 1b of the differential amplifier circuits 1(1) to 1(4) by branch lines 13a to 13d and 17a to 17d which extend along the Y-axis and have a predetermined length. The branch lines 17a to 17d and the main line conductors 11c to 11f intersect each other, with an insulating layer interposed therebetween.

Each of the main line conductors 11b to 11f and 15b to 15f is a transmission line with high characteristic impedance. For example, FIG. 17 shows an equivalent circuit of the structure in which each of the main line conductors 11b to 11f is connected to the differential input terminal 1a of each differential amplifier circuit. The inductance component L of the main line conductor and the parasitic capacitance C of the input terminal 1a form an artificial transmission line. The circuit is designed such that the inductance L and the capacitance C are optimized to obtain broadband transmission characteristics with a high cutoff frequency. In this case, the characteristic impedance of the artificial transmission line is set to be equal to the resistance value of the termination resistor 14.

In FIG. 16 which is a schematic diagram, the differential signal transmission line 90 has a structure which is reversed to the differential signal transmission line 10 which is on the differential input terminal side on the substrate (is obtained by rotating the differential signal transmission line 10 by 180 degrees). Differential output terminals 1c and 1d of each differential amplifier circuit are connected to the differential signal transmission line 90. In the differential distributed amplifier, the output signals which have been input from the differential signal transmission line 10 and then amplified by the differential amplifier circuits are combined with same phase on the differential signal transmission line 90 and signals Vout(+) and Vout(−), which are the amplified signals of the original input signals Vin(+) and Vin(−), are output.

The differential signal transmission line 90 includes a pair of main lines 91 and 95 which extend in parallel along the X-axis with a predetermined gap G′ therebetween. The main line 91 includes main line conductors 91b to 91f which are connected in series to each other from a start terminal (output terminal of the circuit) 91a and the main line 95 includes main line conductors 95b to 95f which are connected in series to each other from a start terminal 95a. The main lines 91 and 95 are connected to differential output terminals 1d and 1c of each differential amplifier circuit by branch lines 93a to 93d and 97a to 97d which extend along the Y-axis and have a predetermined length. The branch lines 97a to 97d and the main line conductors 91c to 91f intersect each other with an insulating layer interposed therebetween. The ends of the main line conductors 91f and 95f are connected to termination resistors 94 and 98, respectively.

Similarly to the input line, the output line is designed such that the inductance components of the main line conductors 91b to 91f and 95b to 95f and the parasitic capacitance of the differential output terminals 1c and 1d form an artificial transmission line with broadband characteristics. In this case, the characteristic impedance of the artificial transmission line is set to be equal to the resistance value of the termination resistor 94 or termination resistor 98.

The electrical lengths of the differential signal transmission lines 10 and 90 are optimized such that the signals input from the start terminals of the differential signal transmission line 10 are sequentially amplified by the differential amplifier circuits 1(1) to 1(4) while being propagated to the end terminals and the amplified signals are combined with same phase while being propagated to the start terminals (the output terminals of the circuit) of the differential signal transmission line 90.

As such, the differential distributed amplifier combines the output signals amplified by a plurality of differential amplifier circuits with same phase. Therefore, it is possible to amplify broadband differential signals with a high gain.

RELATED ART DOCUMENT

Patent Document

[Patent Document 1] JP-A-2006-054765
[Patent Document 2] Japanese Patent No. 3293091
[Patent Document 3] Japanese Patent No. 2882266

DISCLOSURE OF THE INVENTION

Problem that the Invention is to Solve

The characteristic impedance of the artificial transmission line formed by the parasitic capacitance C of the differential circuit and the inductance L of the main line conductor is given by $Z_0=\sqrt{(L/C)}$. When the characteristic impedance of the artificial transmission line is 50Ω which is an industry standard microwave transmission, the characteristic impedance of the main line conductors need to be more than 50Ω (for example, 70Ω). In order to reduce power consumption, increasing the characteristic impedance of artificial transmission line for differential signal transmission, for example, 70Ω, it is necessary to further increase the characteristic impedance of the main line conductors (for example, 90Ω). In the differential signal transmission line 10, when the gap G between the main lines 11 and 15 is reduced and the electromagnetic coupling between the main lines 11 and 15 is too strong, the characteristic impedance is reduced. Therefore, it is necessary to ensure the gap G greater than a predetermined value. For example, a gap of about several tens of micrometers or more is needed in order to obtain a characteristic impedance of 90Ω from the transmission line formed on an InP substrate.

In this case, in the above-mentioned structure in which a plurality of differential circuits are arranged in a line along the longer direction of the main line on the side of a pair of parallel main lines 11 and 15 and a pair of differential terminals of each differential circuit are connected to the main line through a pair of branch lines, the branch lines 17a to 17d branched from the main line 15 need to have a length more than the gap G. Therefore, there is a difference in length corresponding to the gap G between the branch line 13 and the branch line 17.

Patent Document 3 does not disclose a structure related to the differential transmission line, but discloses the problem that, when the branch line is long, a complicated phenomenon, such as the reflection of the signal propagated through the main line from each branch point or multiple reflections in the branch line, occurs, which results in deterioration of signal quality.

As an example of the substantial layout, it is simply considered that the branch line acts as a capacitance by open stub characteristics, on the assumption that the input and output impedances of the differential circuit are sufficiently high and the length of the branch line is less than one-tenth of the wavelength of the operational frequency of the circuit (when the operational frequency of the circuit is up to 64 GHz, the wavelength of the frequency of 64 GHz is 1330 μm in the transmission line formed on the InP substrate and thus one-tenth of the wavelength is about 133 μm).

For the open stub which acts as a capacitance at a wavelength of λ/10 or less, as the length of the open stub increases, the capacitance thereof increases. Therefore, the length of the branch lines 17a to 17d connected to the main line 15 is more than the gap G, which is equivalent to an increase in the capacitance added to the main line 15. As a result, the return loss or broadband characteristics of the main line 15 deteriorate.

Since the branch lines 17a to 17d are longer than the branch line 13 by a value corresponding to the gap G, the equivalent capacitances of the branch lines added to the main lines 11 and 15 by the open stub characteristics are unbalanced and phase shifts of a pair of signals propagated through the main lines 11 and 15 are unequal. In the case of a transmission line in which the characteristic impedance of the main lines 11 and 15 is designed so as to include the electromagnetic coupling therebetween, the characteristic impedance is increased by the unbalanced phase shifts and the return loss or the broadband characteristics deteriorate. In addition, for example, unnecessary electromagnetic radiation noise is generated from the main lines 11 and 15 by the unbalanced phase shifts.

FIG. 18 shows an example of a differential distributed amplifier including a plurality of differential circuits, similarly to FIG. 16. Unlike the structure shown in FIG. 16, an inverting OUT terminal of each differential circuit is opened (or terminated) and only the OUT terminal is connected to a single transmission line 90 to form a differential input-single output structure.

Simulation analysis was performed for the differential signal transmission line connected to the differential input terminals of each differential amplifier circuit using the structure shown in FIG. 18.

The simulation conditions were as follows: a substrate material was InP and had a dielectric constant of 12.4; the thickness of a substrate was 100 μm; the thickness of branch lines and main line conductors formed on the surface of the substrate was 1.5 μm; the thickness of the branch lines formed on the substrate for intersection was 0.5 μm; the thickness of an insulating layer in an intersection portion between the branch line and the main line was 1 μm; main line conductors 11c to 11e and 15c to 15e had a width of 6 μm, a length of 240 μm, an inter-line distance of 70 μm, and a characteristic impedance of 90Ω; main line conductors 11b, 11f, 15b, and 15f had a width of 6 μm, a length of 120 μm, an inter-line distance of 70 μm, and a characteristic impedance of 90Ω; branch lines 13a to 13d had a width of 5 μm and a length of 10 μm; branch lines 17a to 17d had a width of 5 μm and a length of 80 μm; circuit parasitic capacitance was value of 14 fF; and the characteristic impedance of an artificial transmission line formed by the parasitic capacitance and the inductance component of the line was set to 70Ω. In addition, termination resistors 14 and 18 had a resistance value of 70Ω.

Transmission phase characteristics of the main line 11 from the start terminal to the end terminal and transmission phase characteristics of the main line 15 from the start terminal to the end terminal were calculated under these conditions and the calculation result is shown in FIG. 19. As can be seen from FIG. 19, there is a phase difference of 30° between the main lines at a frequency of 64 GHz.

In addition, FIG. 20 shows the simulation result of the return loss of two main lines from the start terminals. As can be seen from FIG. 20, the return loss is increased to −10 dB at a frequency of 64 GHz in the main line 15.

In the structure of the differential signal transmission line shown in FIG. 18, since the branch lines 17a to 17d are long and the equivalent capacitance obtained by the open stub characteristics of the branch lines added to the main line 15 is high, the phase is delayed in the transmission of the main line 15 and the return loss deteriorate. In addition, the equivalent capacitance of the branch lines 17a to 17d by the open stub characteristics is about 7 fF at a frequency of 64 GHz.

FIG. 21 shows the simulation result of the output waveform of a 64-Gbps NRZ signal of the differential distributed amplifier shown in FIG. 18. The transmission characteristics of the main line 15 deteriorate and the jitter is increased.

In the differential signal transmission line having the above-mentioned structure, in addition to the above-mentioned characteristics, a line-surrounded portion with a large area is formed from the start terminal to the end terminal of a pair of main lines 11 and 15 by the main lines 11 and 15 and magnetically-induced disturbance is likely to occur due to external electromagnetic noise which passes through the large line-surrounded portion.

In the case of the differential-output-type differential distributed amplifier shown in FIG. 16, unbalanced phase shifts occur in the differential signal which are propagated through the main lines 91 and 95 due to the influence of the difference G' between the lengths of the conductors of the branch lines 93 and 97. As a result, the impedance of the transmission line deviates from a desired value and unnecessary electromagnetic radiation noise is generated.

The invention has been made in view of the above-mentioned problems and an object of the invention is to provide a differential signal transmission line which can reduce the length of branch lines connecting a pair of main lines and a pair of differential terminals of a differential circuit, can balance the lengths, and suppress the disturbance for differential signal transmission caused by external electromagnetic noise.

Means for Solving the Problem

In order to achieve the above-mentioned object, according to a first aspect of the invention, there is provided a differential signal transmission line (30,50) that transmits and receives differential signals to and from a pair of differential terminals of each of a plurality of differential circuits (21,22, 23,24) which are formed on the side of a pair of main lines on a substrate. The differential signal transmission line includes the pair of main lines (31,35,51,55) that are conductors formed on the substrate and propagate the differential signals, start terminals (31a,35a,51a,55a) that are one ends of the main lines to or from which the differential signals are input or output, end terminals (31m,35m,51m,55m) that are the other ends of the main lines, termination circuits (34,38,54, 58) that are connected to the end terminals, a first intersection portion (39a,39c,59d,59b) arranged on the side of a first differential circuit (21,23) among the plurality of differential circuits and in which conductors of the pair of main lines intersect each other, with an insulating layer interposed therebetween, a first branch line (33a,33c,53d,53b) that is provided between the first intersection portion and the start terminal on one of the pair of main lines which has a point closest in distance to one differential terminal of the first differential circuit in a range from the first intersection portion to the start terminal and is connected to the one differential terminal of the first differential circuit, a second branch line (37a,37c, 57d,57b) that is provided between the first intersection portion and the end terminal on the other of the pair of main lines which has a point closest in distance to the other differential terminal of the first differential circuit in a range from the first intersection portion to the end terminal and is connected to the other differential terminal of the first differential circuit, a second intersection portion (39b,39d,59c,59a) arranged on the side of a second differential circuit (22,24) different from the first differential circuit among the plurality of differential circuits and in which conductors of the pair of main lines intersect each other, with an insulating layer interposed therebetween, a third branch line (33b,33d,53c,53a) that is provided between the second intersection portion and the start terminal on one of the pair of main lines which has a point closest in distance to one differential terminal of the second differential circuit in a range from the second intersection portion to the start terminal and is connected to the one differential terminal of the second differential circuit, and a fourth branch line (37b,37d,57c,57a) that is provided between the second intersection portion and the end terminal on the other of the pair of main lines which has a point closest in distance to the other differential terminal of the second differential circuit in a range from the second intersection portion to the end terminal and is connected to the other differential terminal of the second differential circuit.

According to a second aspect of the invention, in the differential signal transmission line according to the first aspect, the first differential circuit may be arranged on one side of the pair of main lines and the second differential circuit may be arranged on the other side of the pair of main lines. The conductors of the pair of main lines may be connected so as not to intersect each other between the first intersection portion and the second intersection portion.

According to a third aspect of the invention, in the differential signal transmission line according to the first aspect, the first differential circuit and the second differential circuit may be arranged on one side of the pair of main lines, and an intermediate intersection portion (40a-40c,60a-60c) in which conductors of the pair of main lines intersect each other with an insulating layer interposed therebetween may be provided between the first intersection portion and the second intersection portion.

According to a fourth aspect of the invention, in the differential signal transmission line according to the first aspect, a pair of signal input differential terminals of the first differential circuit may be connected to a pair of signal input differential terminals of the second differential circuit.

According to a fifth aspect of the invention, in the differential signal transmission line according to the second aspect, a pair of signal input differential terminals of the first differential circuit may be connected to a pair of signal input differential terminals of the second differential circuit.

According to a sixth aspect of the invention, in the differential signal transmission line according to the third aspect, a pair of signal input differential terminals of the first differential circuit may be connected to a pair of signal input differential terminals of the second differential circuit.

According to a seventh aspect of the invention, in the differential signal transmission line according to the first aspect, a pair of signal output differential terminals of the first differential circuit may be connected to a pair of signal output differential terminals of the second differential circuit.

According to an eighth aspect of the invention, in the differential signal transmission line according to the second aspect, a pair of signal output differential terminals of the first differential circuit may be connected to a pair of signal output differential terminals of the second differential circuit.

According to a ninth aspect of the invention, in the differential signal transmission line according to the third aspect, a pair of signal output differential terminals of the first differential circuit may be connected to a pair of signal output differential terminals of the second differential circuit.

According to a tenth aspect of the invention, in the differential signal transmission line according to the first aspect, a pair of signal output differential terminals of the first differential circuit may be connected to a pair of signal input differential terminals of the second differential circuit.

According to an eleventh aspect of the invention, in the differential signal transmission line according to the second aspect, a pair of signal output differential terminals of the first differential circuit may be connected to a pair of signal input differential terminals of the second differential circuit.

According to a twelfth aspect of the invention, in the differential signal transmission line according to the third aspect, a pair of signal output differential terminals of the first differential circuit may be connected to a pair of signal input differential terminals of the second differential circuit.

According to a thirteenth aspect of the invention, in the differential signal transmission line according to the first aspect, the pair of main lines may be formed such that, among a plurality of line-surrounded portions (45a-45h,65a-65h) which are partitioned by the first and second intersection portions (39a-39d), or the first and second intersection portions and the intermediate intersection portion (40a-40c) provided between the first and second intersection portions in a region surrounded by the pair of main lines, the sum of the areas of the odd-numbered line-surrounded portions from the start terminal is equal to the sum of the areas of the even-numbered line-surrounded portions from the start terminal.

According to a fourteenth aspect of the invention, in the differential signal transmission line according to the second aspect, the pair of main lines may be formed such that, among a plurality of line-surrounded portions (45a-45h,65a-65h) which are partitioned by the first and second intersection portions (39a-39d) in a region surrounded by the pair of main lines, the sum of the areas of the odd-numbered line-surrounded portions from the start terminal is equal to the sum of the areas of the even-numbered line-surrounded portions from the start terminal.

According to a fifteenth aspect of the invention, in the differential signal transmission line according to the third aspect, the pair of main lines may be formed such that, among a plurality of line-surrounded portions (45a-45h,65a-65h) which are partitioned by the first and second intersection portions and the intermediate intersection portion (40a-40c) provided between the first and second intersection portions in a region surrounded by the pair of main lines, the sum of the areas of the odd-numbered line-surrounded portions from the start terminal is equal to the sum of the areas of the even-numbered line-surrounded portions from the start terminal.

According to a sixteenth aspect of the invention, in the differential signal transmission line according to the first aspect, the first and second branch lines or the third and fourth branch lines may also serve as a pair of differential terminals of the differential circuit.

According to a seventeenth aspect of the invention, in the differential signal transmission line according to the second aspect, the first and second branch lines or the third and fourth branch lines may also serve as a pair of differential terminals of the differential circuit.

According to an eighteenth aspect of the invention, in the differential signal transmission line according to the third aspect, the first and second branch lines or the third and fourth branch lines may also serve as a pair of differential terminals of the differential circuit.

According to a nineteenth aspect of the invention, in the differential signal transmission line according to the first aspect, the differential signal transmission line may be a balanced line type in which the pair of main lines are electromagnetically coupled each other, a micro strip type in which a reference conductor facing the pair of main lines, a coplanar type in which a reference conductor formed on the side of the pair of main lines, or a combination thereof.

Advantage of the Invention

According to the above-mentioned structure, in the differential signal transmission line according to the first aspect of the invention which transmits and receives the differential signals to and from a pair of differential terminals of each of a plurality of differential circuits arranged on the side of a pair of main lines, the first branch line that is provided in one of the pair of main lines which is close to one differential terminal of the first differential circuit in a range from the first intersection portion to the start terminal on the line is connected to the one differential terminal, and the second branch line that is provided in the other main line close to the other differential terminal of the first differential circuit in a range from the first intersection portion to the end terminal on the line is connected to the other differential terminal. In addition, the third branch line that is provided in one of the pair of main lines which is close to one differential terminal of the second differential circuit in a range from the second intersection portion to the start terminal on the line is connected to the one differential terminal, and the fourth branch line that is provided in the other main line close to the other differential terminal of the second differential circuit in a range from the second intersection portion to the end terminal on the line is connected to the other differential terminal. Therefore, it is possible to reduce and equalize the lengths of a pair of branch lines connected to a pair of differential terminals of each differential circuit. The influence on the transmission characteristics due to the branch line is reduced and the transmission characteristics of a pair of lines are balanced. In addition, the return loss does not deteriorate. Therefore, it is possible to prevent deterioration of the quality of an output signal and obtain broadband characteristics.

In addition, since the main lines through which the current of the differential signal flows intersect each other, the electrical influence of external electromagnetic noise which passes through the line-surrounded portion formed by the main lines is cancelled in adjacent line-surrounded portions partitioned by the intersection portions and the transmission line is little affected by magnetically-induced disturbance caused by the external electromagnetic noise.

As in the second aspect, when the first differential circuit is arranged on one side of the main lines and the second differential circuit is arranged on the other side of the main lines, the main line conductors are connected so as not to intersect each other between the first intersection portion and the second intersection portion. Therefore, the main lines can be connected to a plurality of differential circuits in which the differential terminals with the same polarity are provided on the start terminal side and which are arranged so as to diagonally face each other, with a small number of intersection portions.

As in the third aspect, when the first differential circuit and the second differential circuit are arranged on one side of the main lines, the intermediate intersection portion is provided between the first intersection portion and the second intersection portion. Therefore, the arrangement of positive signal (V(+)) line and negative signal (V(−)) line interchanged at the first intersection portion returns to the original state of arrangement at the intermediate intersection portion. In particular, when a differential distributed amplifier is designed, it is possible to arrange the polarities of the differential terminals of all differential circuits in the same layout and all of the differential circuits can have the same circuit structure or layout pattern. Therefore, it is easy to design the circuit.

As in the fourth to twelfth aspects, it is possible to correspond to any one of the following aspects: an aspect in which a pair of signal input differential terminals of the differential circuit are connected to each other; an aspect in which a pair of signal output differential terminals of the differential circuit are connected to each other; and an aspect in which a pair of signal output differential terminals and a pair of signal input differential terminals of the differential circuits are connected to each other. Therefore, the line connecting the differential circuits has high versatility.

As in the thirteenth to fifteenth aspects of the invention, the pair of main lines are formed such that, among a plurality of line-surrounded portions which are partitioned by the first and second intersection portions or the first and second intersection portions and the intermediate intersection portion provided between the first and second intersection in a region surrounded by the pair of main lines, the sum of the areas of the odd-numbered line-surrounded portions from the start terminal is equal to the sum of the areas of the even-numbered line-surrounded portions from the start terminal. According to this structure, the influence of external electromagnetic noise which passes through the odd-numbered line-surrounded portions and the influence of external electromagnetic noise which passes through the even-numbered line-surrounded portions cancel each other and it is possible to minimize the influence of external electromagnetic noise.

As in the sixteenth to eighteenth aspects of the invention, the branch line also serves as the differential terminal of the differential circuit, that is, the differential terminal is substantially directly connected to the main line. According to this structure, the main line can be connected to the differential circuit at the shortest distance, without passing through a connection line. Therefore, it is possible to neglect the influence of the branch line and it is easy to design the circuit.

BEST MODE FOR CARRYING OUT THE INVENTION

Figure 16:
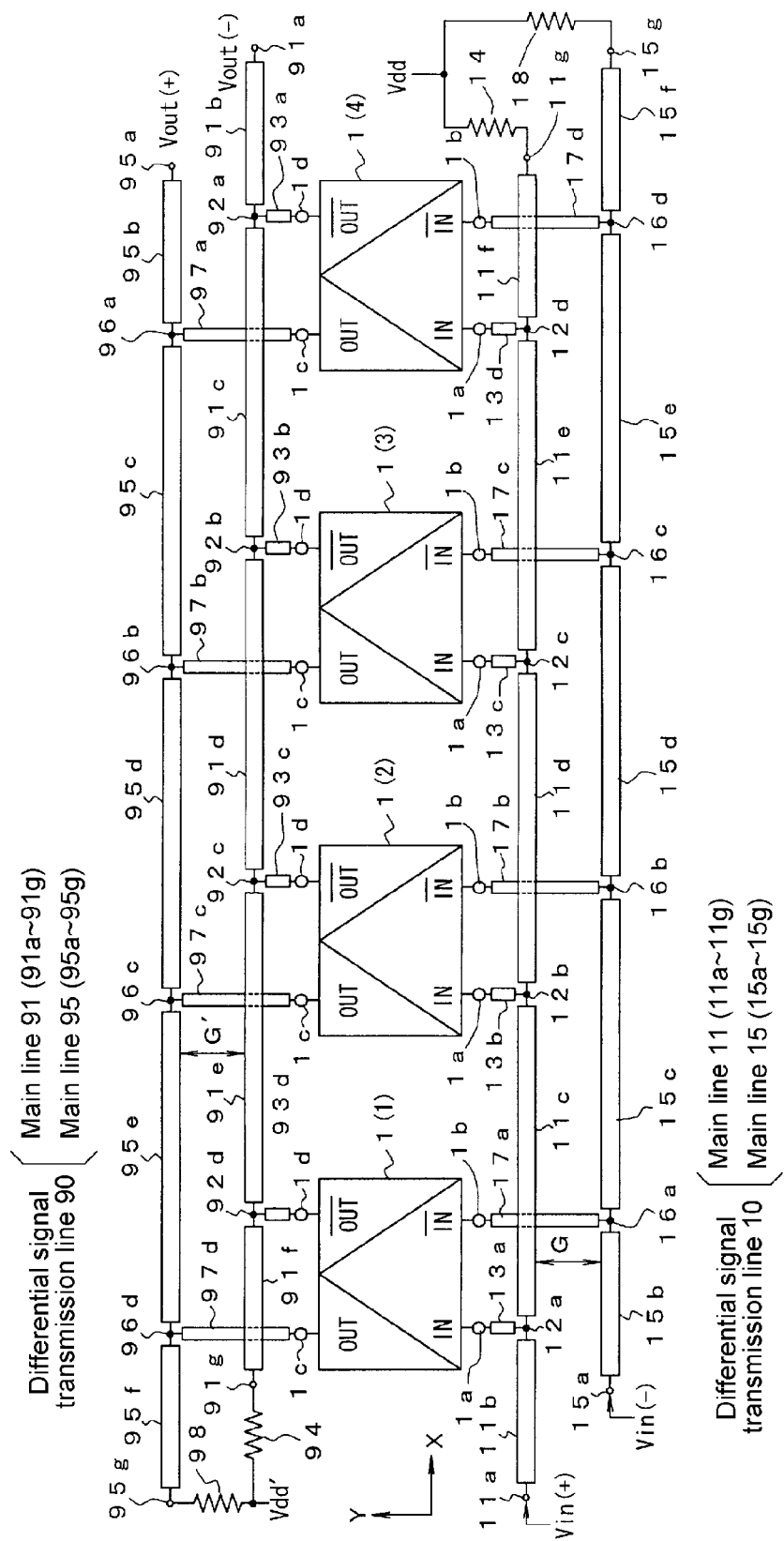
FIG. 16 is a diagram illustrating the structure of a differential distributed amplifier using a differential signal transmission line according to the related art.
Figure 17:
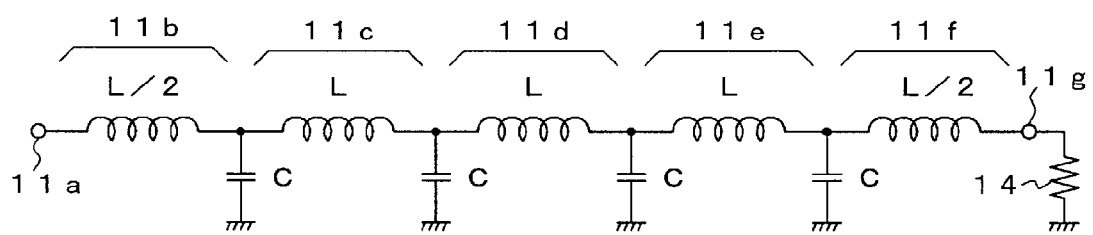
FIG. 17 is an equivalent circuit of a main line of an input-side differential signal transmission line shown in FIG. 16.
Figure 18:
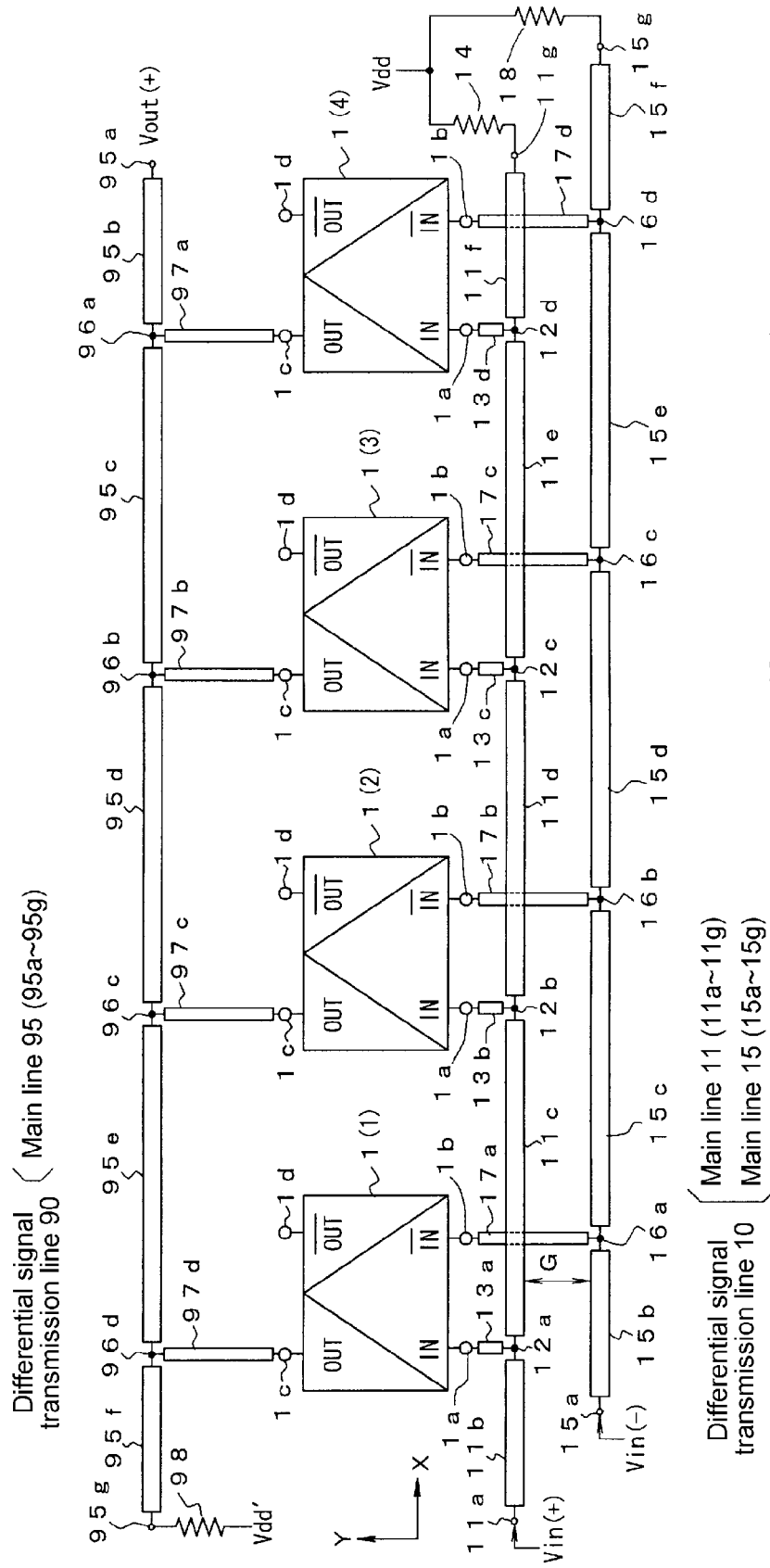
FIG. 18 is a diagram illustrating a circuit in which an output-side line of the differential distributed amplifier shown in FIG. 16 is a single-phase line.

Hereinafter, embodiments of the invention will be described with reference to the accompanying drawings. A 'first differential circuit' and a 'second differential circuit' according to the invention may be some or all of a plurality of differential circuits which are arranged on the side of a pair of main lines and are connected to the main lines. In the following embodiments, an example of a circuit formed only by differential circuits corresponding to the 'first differential circuit' and the 'second differential circuit' will be described. For example, the invention can be similarly applied to a structure in which other differential circuits are connected between these main differential circuits and to the start and end terminals by a connection method different from that according to the invention shown in FIG. 16.

Figure 1:
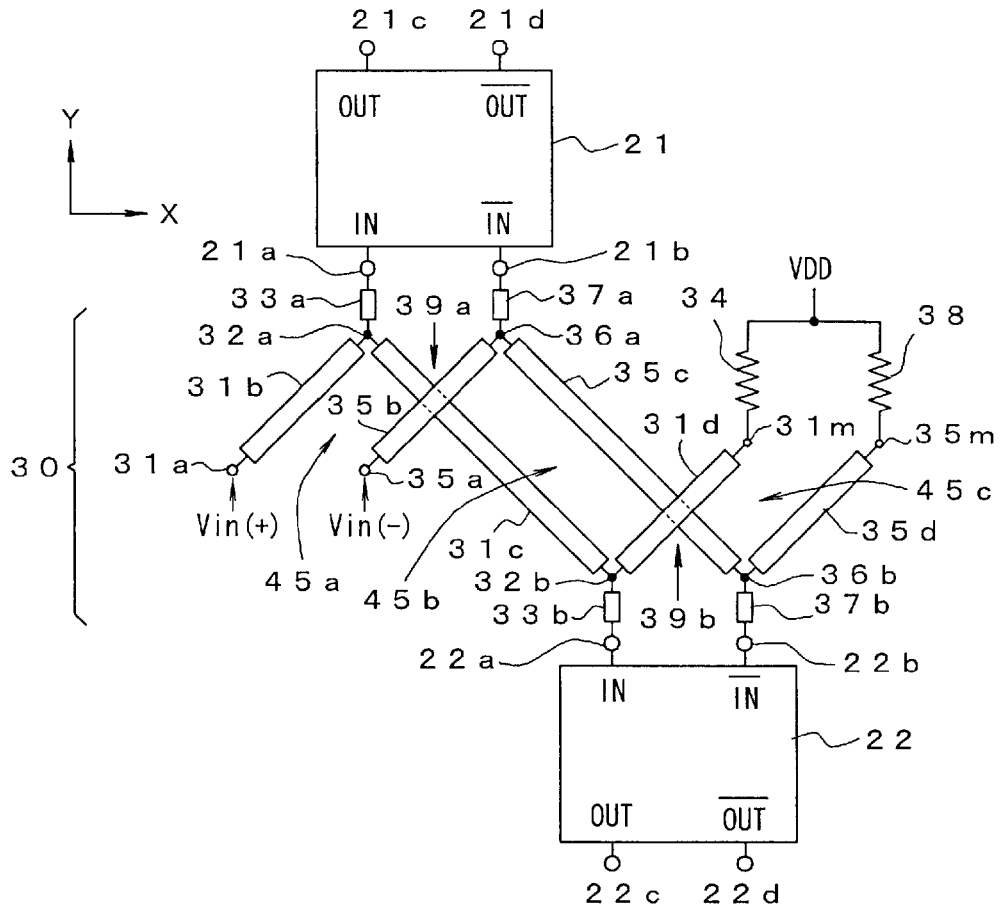
FIG. 1 is a diagram illustrating a minimum-size structure when a differential signal transmission line according to an embodiment of the invention is used to connect to circuits which are arranged on both sides of the line.

FIG. 1 shows an example of a minimum-size circuit 20 using a differential signal transmission line according to the invention. In practice, the circuit 20 is formed on a semiconductor substrate (for example, a GaAs or InP substrate) by an etching process. However, here, for ease of understanding of arrangement on the substrate, FIG. 1 schematically shows the structure, as viewed from the upper surface of the substrate. In addition, for convenience of explanation of the structure, the two-dimensional rectangular coordinate system including the X-axis and the Y-axis is used.

In the circuit 20 shown in FIG. 1, two differential circuits 21 and 22 having the same input parasitic capacitance are arranged such that their sides which differential input terminals are arranged are diagonally opposite to each other, a pair of differential signal transmission lines 30 extend in the X-axis direction between the two differential circuits 21 and 22 while intersecting each other in a zigzag and are connected to the differential input terminals of the two differential circuits 21 and 22. The two differential circuits 21 and 22 are, for example, amplifier circuits or latch circuits. In the circuit 20, differential signals Vin(+) and Vin(−) (for example, clock signals of several tens of gigahertz) input to the differential signal transmission line 30 are divided into the two differential circuits 21 and 22 which are arranged on both sides of the line (in the example of the circuit, one of the two differential circuits 21 and 22 corresponds to the 'first differential circuit' according to the invention and the other differential circuit corresponds to the 'second differential circuit' according to the invention).

Figure 2:
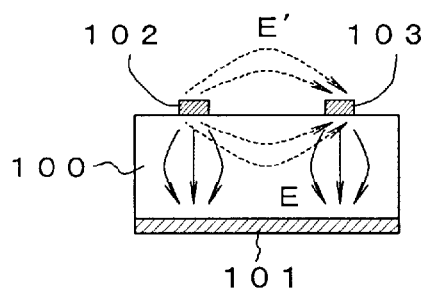
FIG. 2 is a diagram illustrating an example of the structure of the differential signal transmission line.

The differential signal transmission line 30 is, for example, a micro-strip-type line or a balanced line including a reference ground conductor 101 which is formed on the lower surface (or a surface that is one layer down) of a substrate 100 and a pair of main lines 102 and 103 which are formed in parallel to each other on the surface of the substrate 100 with a predetermined gap G therebetween, as shown in the cross-sectional structure of FIG. 2. Examples of the micro-strip-type line include an inverted micro-strip line in which a signal line and a ground conductor are inverted in the vertical direction and a strip line in which a signal line is interposed between the upper and lower ground conductors.

In the case of the micro-strip-type line, the electric field E begin on main lines 102 and 103 and end on ground conductor 101. In the case of the balanced line, the electric field E' begin on one main line 102 and end on the other main line 103. Therefore, in principle, it is possible to omit the ground conductor. In addition, a differential signal transmission line with the characteristics of both the micro-strip type and the balance type may be used, depending on the relationship between the gap between the main lines 102 and 103 and the thickness of the substrate.

Examples of this type of transmission line include, in addition to the micro-strip-type line and the balanced line, a coplanar line in which the ground conductor which is formed with a predetermined gap from the side of the main line may be used and combinations of these. Examples of the coplanar line include a typical coplanar line in which the ground conductors are formed on both sides of the main line, an asymmetric coplanar strip line in which the ground conductor is formed only one side of the main line, and a grounded coplanar line in which the ground conductor formed on the lower surface of the substrate may be also used. In this embodiment and the following embodiments, the type of transmission line is any one of the above-mentioned types.

In general, the pair of main lines of the transmission line is formed with a constant gap therebetween from the start terminal to the end terminal in order to maintain characteristic impedance at a constant level. However, in the invention, intersection portions are provided in the pair of main lines.

That is, one main line 31 forming the differential signal transmission line 30 shown in FIG. 1 propagates one differential signal Vin(+) input to an input terminal 31a, which is a start terminal of the transmission line, to a first branch point 32a through a main line conductor 31b that has a length La and is inclined at a predetermined angle (for example, 45°) so as not to be perpendicular to the X-axis and propagates the differential signal Vin(+) from the first branch point 32a to a main line conductor 31c that has a length Lb (for example, Lb=2La) and has a slope opposite to the slope of the main line conductor 31b. The first branch point 32a and one differential input terminal (non-inverted terminal) 21a of the differential amplifier circuit 21 are connected to each other by a branch line 33a.

The signal propagated to the main line conductor 31c is propagated through a second branch point 32b and a main line conductor 31d with the same length and slope as the main line conductor 31b and is terminated at a termination resistor 34 that is connected to the end of a main line conductor 31d, which is an end terminal 31m of the main line 31. The second branch point 32b and one differential input terminal (non-inverted terminal) 22a of the differential amplifier circuit 22 are connected to each other by a branch line 33b.

The other main line 35 of the differential signal transmission line 30 propagates one differential signal Vin(−) input to an input terminal 35a, which is a start terminal of the transmission line, to a first branch point 36a through a main line conductor 35b that has the same length and slope as the main line conductor 31b and is formed with a predetermined gap from the main line conductor 31b, and propagates the differential signal Vin(−) from the first branch point 36a to a main line conductor 35c that has a length Lb and has a slope opposite to the slope of the main line conductor 35b. The first branch point 36a and the other differential input terminal (inverted terminal) 21b of the differential amplifier circuit 21 are connected to each other by a branch line 37a.

The signal propagated to the main line conductor 35c is propagated through a second branch point 36b and a main line conductor 35d with the same length and slope as the main line conductor 35b and is terminated at a termination resistor 38 that is connected to the end of a main line conductor 35d, which is an end terminal 35m of the main line 35. The second branch point 36b and the other differential input terminal (inverted terminal) 22b of the differential amplifier circuit 22 are connected to each other by a branch line 37b.

In the circuit 20 shown in FIG. 1, intersection portions 39a and 39b are provided in the pair of main lines 31 and 35 so as to correspond to the positions where the differential circuits 21 and 22 are formed. The branch line 33a connects the differential input terminal 21a and the branch point 32a which is provided in one main line 31 (which has a point closest in distance to the terminal 21a) close to one differential input terminal 21a of the differential circuit 21 in the range from the intersection portion 39a to the start terminal on the line. The branch line 37a connects the differential input terminal 21b and the branch point 36a which is provided in the other main line 35 (which has a point closest in distance to the terminal 21b) close to the other differential input terminal 21b of the differential circuit 21 in the range from the intersection portion 39a to the end terminal on the line.

Similarly, the branch line 33b connects one differential input terminal 22a of the differential circuit 22 and the branch point 32b which is provided in one main line 31 (which has a point closest in distance to the terminal 22a) close to one differential input terminal 22a of the differential circuit 22 in the range from the intersection portion 39b to the start terminal on the line. The branch line 37b connects the other differential input terminal 22b of the differential circuit 22 and the branch point 36b which is provided in the other main line 35 (which has a point closest in distance to the terminal 22b)

close to the other differential input terminal 22b of the differential circuit 22 in the range from the intersection portion 39b to the end terminal on the line.

As such, the intersection portions 39a and 39b are provided in the pair of main lines 31 and 35 at positions corresponding to the differential circuits 21 and 22, and the branch lines connect the branch points which are provided on the start terminal side and the end terminal side of the intersection portion and the pair of differential input terminals of each of the corresponding differential circuits 21 and 22. Therefore, it is possible to equalize the lengths of the pairs of branch lines (33a, 37a) and (33b, 37b) and to reduce the lengths.

Since the differential circuits 21 and 22 are the same circuits formed on the same substrate, the differential input terminals 21a, 21b, 22a, and 22b have substantially the same input parasitic capacitance. Therefore, capacitances (the composite capacitances of the equivalent capacitances obtained by the open stub characteristics of the branch lines and the input parasitic capacitances of the differential circuits) $Cin_{32a}$, $Cin_{32b}$, $Cin_{36a}$, and $Cin_{36b}$ added to the branch points 32a, 32b, 36a, and 36b are equal to each other. Since the branch line is short, it is possible to reduce the equivalent capacitance obtained by the open stub characteristics of the branch line.

The pairs of main line conductors $\{31a, 35a\}$ to $\{31d, 35d\}$ of the main lines 31 and 35 are formed in parallel to each other in the same shape on the same plane and have the same cross-sectional shape, thickness, or width. Therefore, the characteristic impedances or inductance components of the pair of main line conductors with respect to the GND plane can be substantially equal to each other.

However, when the main line conductors, such as the main line conductors 31c and 35b, intersect each other, it is difficult to calculate characteristic impedance. However, when the main line conductors intersect at a right angle as in this example, there is no mutual inductance between the main line conductors which intersect each other and only the capacitance which is fabricated at the intersection portions 39a and 39b may be considered as a factor causing impedance disturbance.

Figure 3:
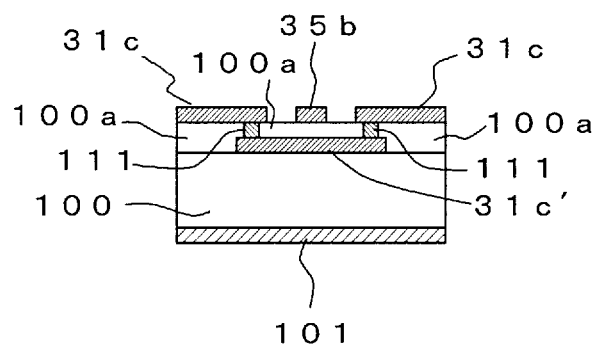
FIG. 3 is a diagram illustrating an example of the structure of an intersection portion.

FIG. 3 shows an example of the cross-sectional structure of the intersection portion 39, in which a main line conductor intermediate portion 31c' is provided below the main line conductor 35b which is provided on the surface of the substrate 100, with an insulating layer 100a interposed therebetween. In FIG. 3, reference numeral 111 is a through hole. It is preferable that the insulating layer 100a have a low dielectric constant and low dielectric loss. For example, the insulating layer 100a is made of polyimide or BCB (benzocyclo butene).

As in the following simulation analysis, when the characteristic impedance of the main line conductor is set to 90Ω, for example, the detailed numerical values of the substantial structure are as follows: the width of the main line conductor is 6 μm; the thickness of the insulating layer is 1 μm; and the dielectric constant of BCB, which is a material forming the insulating layer, is about 2.8. In this case, the capacitance of the intersection portion between the main line conductors is a very small value of about 0.9 fF. When the capacitance is 0.9 fF, the impedance |Zc| of the capacitance is 1770Ω even at a high frequency of 100 GHz. When a signal of several tens of gigahertz is transmitted through a transmission line with a characteristic impedance of several tens of ohms, the influence of the capacitance is substantially negligible. In addition, even when it is necessary to increase the width of the main line conductor to be greater than the above-mentioned value in order to reduce the characteristic impedance of the main line conductor, it is possible to reduce the capacitance value of the intersection portion by increasing the thickness of the insulating layer in the range of several micrometers. In addition, it is possible to reduce the influence of the capacitance by reducing the line width of the intersection portion to locally increase the characteristic impedance, thereby cancelling the capacitance component of the intersection portion.

Figure 4:
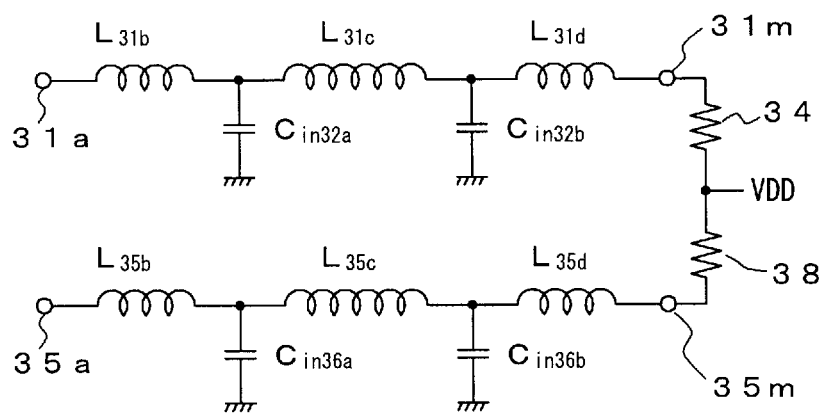
FIG. 4 is an equivalent circuit diagram of the differential signal transmission line.

When the values of the inductance components of the pairs of main line conductors $\{31b, 35b\}$ to $\{31d, 35d\}$ are $\{L_{31b}, L_{35b}\}$ to $\{L_{31d}, L_{35d}\}$, the electrical equivalent circuit of the structure in which the input terminals of the differential circuits 21 and 22 are connected to the differential signal transmission line 30 in FIG. 1 is as shown in FIG. 4 since the capacitance generated in the intersection portion of the main line conductor is small and is negligible.

As can be seen from FIG. 4, a ladder filter formed by the inductance components $\{L_{31b}, L_{35b}\}$ to $\{L_{31d}, L_{35d}\}$ of the main line conductors and the capacitances $Cin_{32a}$, $Cin_{32b}$, $Cin_{36a}$, and $Cin_{36b}$ added to the branch points forms an artificial transmission line, and inductance and capacitance are optimized such that broadband transmission characteristics are obtained. As described above, since the lengths of the branch lines are equal to each other, it is possible to equalize the values of the capacitances $Cin_{32a}$, $Cin_{32b}$, $Cin_{36a}$, and $Cin_{36b}$. Therefore, the main lines 31 and 35 have the same transmission characteristics and same phase shifts (the same electrical length). In addition, since the length of the branch line can be reduced, it is possible to reduce unnecessary equivalent capacitance due to the open stub characteristics and thus obtain low return loss characteristics.

In the differential signal transmission line 30, a plurality of line-surrounded portions 45a to 45c which are partitioned by the plurality of intersection portions 39a and 39b are formed in a region surrounded by the pair of main lines 31 and 35 which extend from the start terminals 31a and 35a to the end terminals 31m and 35m, respectively (it is assumed that the line-surrounded portions are closed at the start terminal to which a signal is input and the end terminal where a signal is absorbed).

For example, when there is electromagnetic noise which passes through the wide range of the entire substrate, the influence of the electromagnetic noise corresponds to the area of each line-surrounded portion. The direction of the flowing noise caused by electromagnetic noise in transmission line is determined by the arrangement of lines surrounding the line-surrounded portion. When the intersection portions 39a and 39b are provided in the lines as described above, the direction of the flowing noise is caused by electromagnetic noise inverted front and back the intersection portions 39a and 39b.

Therefore, the electrical influence of external electromagnetic noise which passes through the line-surrounded portions formed by the main lines 31 and 35 is cancelled in adjacent line-surrounded portions which are partitioned by the intersection portions 39a and 39b. The cancelling effect is improved as the difference between the sum of the areas of the odd-numbered line-surrounded portions from the start terminal and the sum of the areas of the even-numbered line-surrounded portions from the start terminal is reduced. The circuit is less likely to be subjected to magnetically-induced disturbance. When the sums of the areas are equal to each other, it is possible to theoretically reduce the influence of the electromagnetic noise to zero.

In particular, in the above-mentioned structure of the main line conductor (the structure in which the gap between the main lines 31 and 35 is constant and the length of the intermediate main line conductor is two times more than the length of the first and last main line conductors), the area Sa of the first line-surrounded portion 45a from the start terminal is substantially equal to the area Sc of the third line-surrounded portion 45c and the area Sb of the second (even-numbered) line-surrounded portion 45b is substantially two times more than the area Sa(Sc) and is substantially equal to the sum of the areas of the odd-numbered line-surrounded portions. Therefore, the influence of external electromagnetic noise which passes through the odd-numbered line-surrounded portions 45a and 45c and the influence of external electromagnetic noise which passes through the even-numbered line-surrounded portion 45b cancel each other. As a result, it is possible to minimize the influence of external electromagnetic noise.

The example of the structure shown in FIG. 1 is the minimum-size differential signal transmission line 30 in which differential signals are input to the differential circuits 21 and 22 which are arranged on both sides of the pair of main lines 31 and 35 so as to be diagonally opposite to each other. However, the pair of main lines 31 and 35 may extend such that differential signals can be input to three or more differential circuits and the termination resistors 34 and 38 may be connected to the ends of the main lines 31 and 35. According to this structure, it is possible to input differential signals to a large number of differential circuits.

Figure 5:
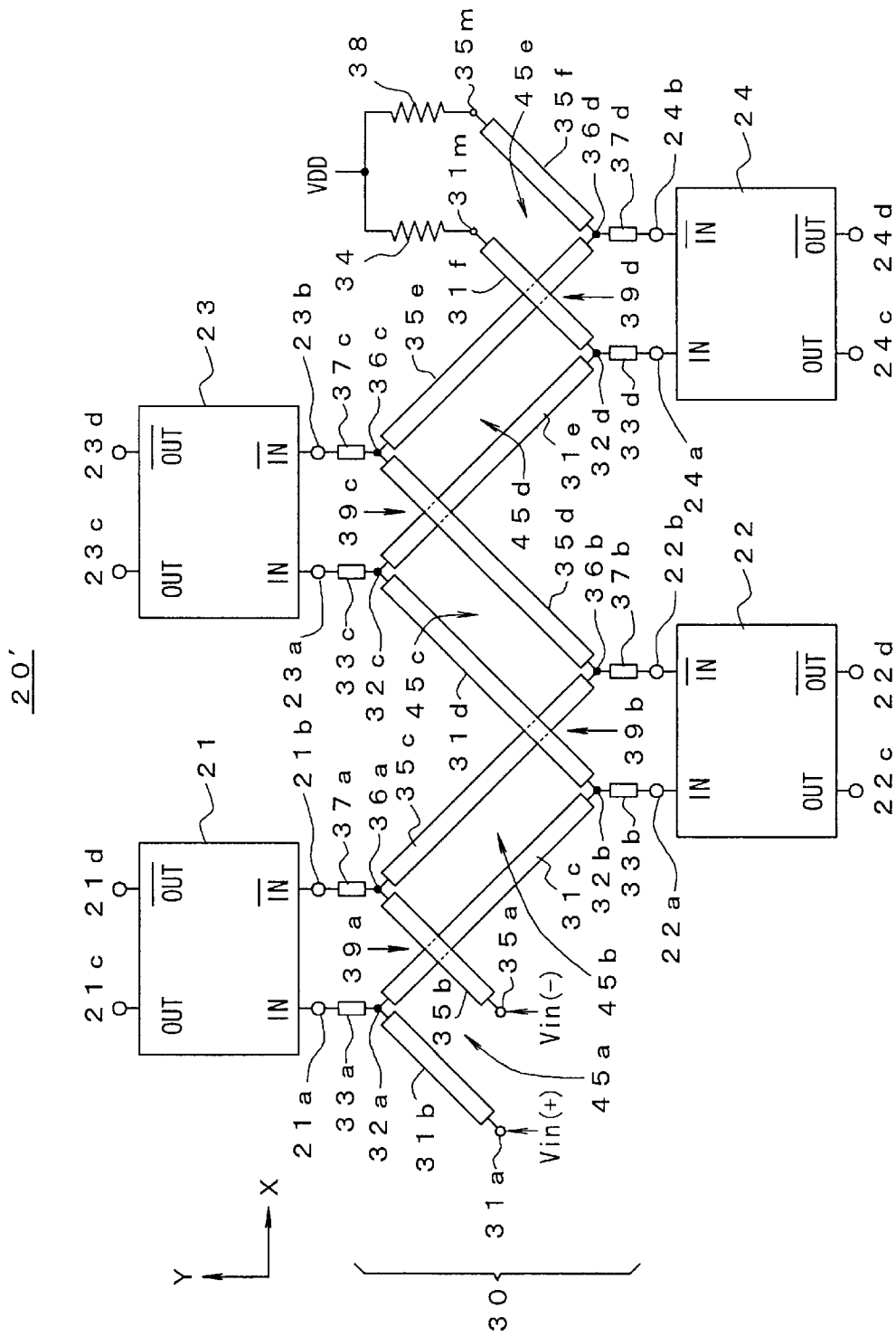
FIG. 5 is a circuit diagram illustrating an extended structure in which the differential signal transmission line shown in FIG. 1 can be connected to four differential circuits.

FIG. 5 is a diagram illustrating a circuit 20' which is an example of the above-mentioned structure, in which differential signals are sequentially input to four differential circuits 21 to 24 which are arranged on both sides of a differential signal transmission line 30 so as to be diagonally opposite to each other. In the circuit 20', a differential signal Vin(+) input to an input terminal 31a, which is a start terminal of a main line 31, is propagated through a main line conductor 31b which has a length La and is inclined at an angle of, for example, 45 degrees with respect to the X-axis, a branch point 32a, a main line conductor 31c which has a length Lb (for example, Lb=2La) and has a slope opposite to the slope of the main line conductor 31b, a branch point 32b, a main line conductor 31d which has the same length as the main line conductor 31c and has a slope opposite to the slope of the main line conductor 31c, a branch point 32c, a main line conductor 31e which has the same length and slope as the main line conductor 31c, a branch point 32d, and a main line conductor 31f which has the same length and slope as the main line conductor 31b and is terminated at a termination resistor 34 connected to an end terminal 31m which is the end of the main line 31.

Similarly, a differential signal Vin(-) input to an input terminal 35a, which is a start terminal of a main line 35, is propagated through a main line conductor 35b which has the same length and slope as the main line conductor 31b, a branch point 36a, a main line conductor 35c which has the same length and slope as the main line conductor 31c, a branch point 36b, a main line conductor 35d which has the same length and slope as the main line conductor 31d, a branch point 36c, a main line conductor 35e which has the same length and slope as the main line conductor 31e, a branch point 36d, and a main line conductor 35f which has the same length and slope as the main line conductor 31f and is terminated at a termination resistor 38 connected to an end terminal 35m, which is the end of the main line 35.

A pair of branch points 32a and 36a are connected to differential input terminals 21a and 21b of a differential circuit 21 through branch lines 33a and 37a, respectively, and a pair of branch points 32b and 36b are connected to differential input terminals 22a and 22b of a differential circuit 22 through branch lines 33b and 37b, respectively. A pair of branch points 32c and 36c are connected to differential input terminals 23a and 23b of a differential circuit 23 through branch lines 33c and 37c, respectively, and a pair of branch points 32d and 36d are connected to differential input terminals 24a and 24b of a differential circuit 24 through branch lines 33d and 37d, respectively.

In the circuit 20', intersection portions 39a to 39d are provided in the main lines 31 and 35 so as to correspond to the differential circuits 21 to 24 and branch points of the main lines which are disposed on the start terminal side and the end terminal side of each intersection portion are connected to the pair of differential input terminals of each of the differential circuits 21 to 24. Therefore, it is possible to equalize the lengths of pairs of branch lines (33a, 37a), (33b, 37b), (33c, 37c), and (33d, 37d) for connection to the differential terminals and to reduce the lengths. As a result, the same effect as that of the circuit shown in FIG. 1 is obtained.

In the above-mentioned structure of the circuit 20', the sum of the areas of the odd-numbered line-surrounded portions 45a, 45c, and 45e from the start terminal is substantially equal to the sum of the areas of the even-numbered line-surrounded portions 45b and 45d from the start terminals. The influence of external electromagnetic noise which passes through the odd-numbered line-surrounded portions 45a, 45c, and 45e and the influence of external electromagnetic wave noise which passes through the even-numbered line-surrounded portions 45b and 45d cancel each other. Therefore, it is possible to minimize the influence of external electromagnetic noise.

As in the differential signal transmission line 30, the odd-numbered differential circuits 21 and 23 are arranged on one side of the pair of main lines 31 and 35 and the even-numbered differential circuits 22 and 24 are arranged on the other side of the pair of main lines 31 and 35, and odd-numbered intersection portions are provided at positions corresponding to the odd-numbered differential circuits, even-numbered intersection portions are provided at positions corresponding to the even-numbered differential circuits, and the main line conductors are connected so as not to intersect each other between an odd-numbered intersection portion and an even-numbered intersection portion. Therefore, it is possible to connect the main lines to a plurality of differential circuits which are arranged so as to be diagonally opposite to each other and in which the differential terminals with the same polarity are provided on the start terminals side, while reducing the number of intersection portions.

In the differential signal transmission line 30 used in the circuits 20 and 20', the differential signals are input to the differential circuits which are arranged on both sides of the pair of main lines 31 and 35. However, as in a circuit 120 shown in FIG. 6, a differential signal transmission line 30 may be used in which differential signals are input to differential circuits 21 and 22 which are arranged on one side of a pair of main lines 31 and 35.

Figure 6:
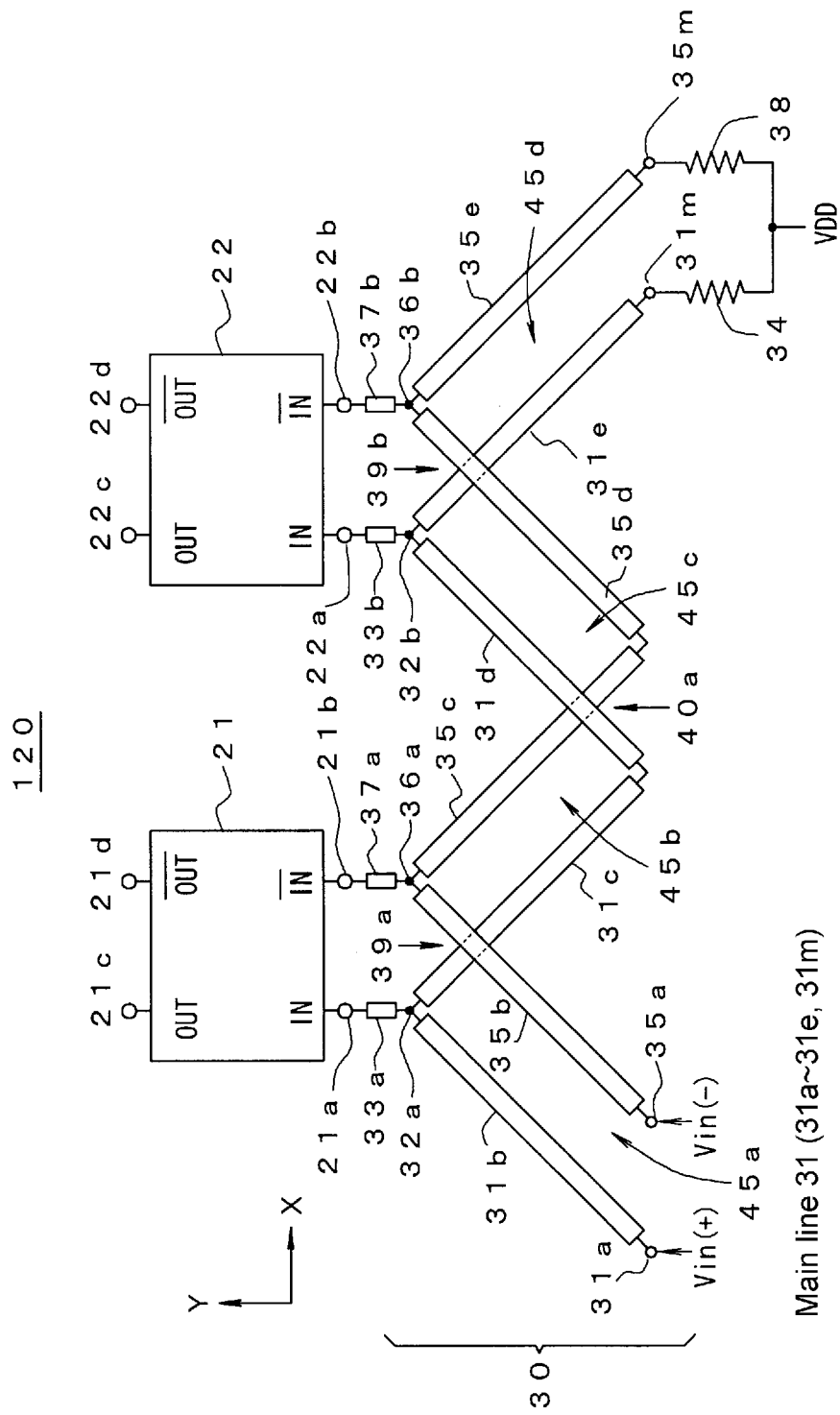
FIG. 6 is a diagram illustrating a minimum-size structure when the differential signal transmission line according to the embodiment of the invention is used to connect circuits which are arranged on one side of the line.

In one main line 31 of the differential signal transmission line 30 shown in FIG. 6, one differential signal Vin(+) input to an input terminal 31a, which is a start terminal, is propagated through a main line conductor 31b which has a length La and is inclined at a predetermined angle (for example, 45°) so as not to be perpendicular to the X-axis, a branch point 32a, a main line conductor 31c which has a length Lb (for example, Lb=La) and has a slope opposite to the slope of the main line conductor 31b, a main line conductor 31d which has the same slope as the main line conductor 31b and has the same length as the main line conductor 31c, a branch point 32b, and a main line conductor 31e which has a length La and has the same slope as the main line conductor 31c and is terminated at a termination resistor 34 connected to an end terminal 31m.

In the other main line 35, one differential signal Vin(−) input to an input terminal 35a, which is a start terminal, is propagated through a main line conductor 35b which has the same length and slope as the main line conductor 31b, a branch point 36a, a main line conductor 35c which has the same length and slope as the main line conductor 31c, a main line conductor 35d which has the same length and slope as the main line conductor 31d, a branch point 36b, and a main line conductor 35e which has the same length and slope as the main line conductor 31e and is terminated at a termination resistor 38 connected to an end terminal 35m.

Similarly to the structure shown in FIG. 1, a pair of branch points 32a and 36a are connected to differential input terminals 21a and 21b of the differential circuit 21 through branch lines 33a and 37a, respectively, and the branch points 32b and 36b are connected to differential input terminals 22a and 22b of the differential circuit 22 through branch lines 33b and 37b, respectively.

In the differential signal transmission line 30 shown in FIG. 6, the intersection portions 39a and 39b are provided in the pair of main lines 31 and 35 at positions corresponding to the differential circuits 21 and 22 and the branch lines connect the branch points which are provided on the start terminal side and the end terminal side of each intersection portion and a pair of differential input terminals of each of the corresponding differential circuits 21 and 22. Therefore, it is possible to equalize the lengths of the pairs of branch lines (33a, 37a) and (33b, 37b) for connection to the differential terminals and to reduce the lengths.

Similarly to the structure shown in FIG. 1, the pairs of main line conductors {31b, 35b} to {31e, 35e} of the pair of main lines 31 and 35 are formed in parallel in the same shape on the same plane and have the same cross-sectional shape, thickness, or width. Therefore, the characteristic impedances and inductance components of the pair of main line conductors with respect to the GND plane can be substantially equal to each other. Thus, in the differential signal transmission line 30, the differential signal transmission characteristics without unbalanced phase shifts are obtained. In addition, the branch line is short and unnecessary equivalent capacitance caused by the open stub characteristics is small. As a result, low return loss characteristics are obtained.

In the circuit 120 shown in FIG. 6, an intermediate intersection portion 40a in which the main line conductors 31d and 35c of the pair of main lines intersect each other is provided between the intersection portions 39a and 39b which are provided at the positions corresponding to the differential circuits 21 and 22. Therefore, the arrangement of positive signal (V(+)) line and negative signal (V(−)) line interchanged at the intersection portion 39a returns to the original state of arrangement at the intermediate intersection portion 40a. In particular, when a differential distributed amplifier is designed, it is possible to arrange the polarities of the differential terminals of the differential circuits 21 and 22 which are arranged on one side of a pair of main lines 31 and 35 in the same layout and all of the differential circuits can have the same circuit structure or layout pattern. Therefore, it is easy to design the circuit.

Similarly to the intersection portions 39a and 39b, in the intermediate intersection portion 40a, the pair of main line conductors intersect at an angle of 90°. Therefore, there is no mutual inductance between the main line conductors and only the capacitance fabricated in the intersection portion may be considered as a factor causing impedance disturbance. The capacitance can be so small as to be negligible since the intersection portions intersect each other, with an insulating layer having a low dielectric constant interposed therebetween.

In the case of the differential signal transmission line 30 used in the circuit 120, four line-surrounded portions 45a to 45d are formed by the two intersection portions 39a and 39b and the intermediate intersection portion 40a provided between the two intersection portions 39a and 39b. In the above-mentioned structure of the main line conductors, the sum of the areas of the odd-numbered line-surrounded portions 45a and 45c from the start terminal is substantially equal to the sum of the areas of the even-numbered line-surrounded portions 45b and 45d from the start terminal. Therefore, the influence of external electromagnetic noise which passes through the odd-numbered line-surrounded portions 45a and 45c and the influence of external electromagnetic noise which passes through the even-numbered line-surrounded portions 45b and 45d cancel each other and it is possible to minimize the influence of external electromagnetic noise.

When the structure of the circuit 120 shown in FIG. 6 is used as a minimum-size structure, the main lines extend depending on the number of differential circuits, and termination resistors 34 and 38 are connected to the end terminals of the main lines, it is possible to input differential signals to a large number of differential circuits. In this case, output terminals can also be connected to the same differential signal transmission line. Therefore, the circuit is suitable for the above-mentioned differential distributed amplifier.

Figure 7:
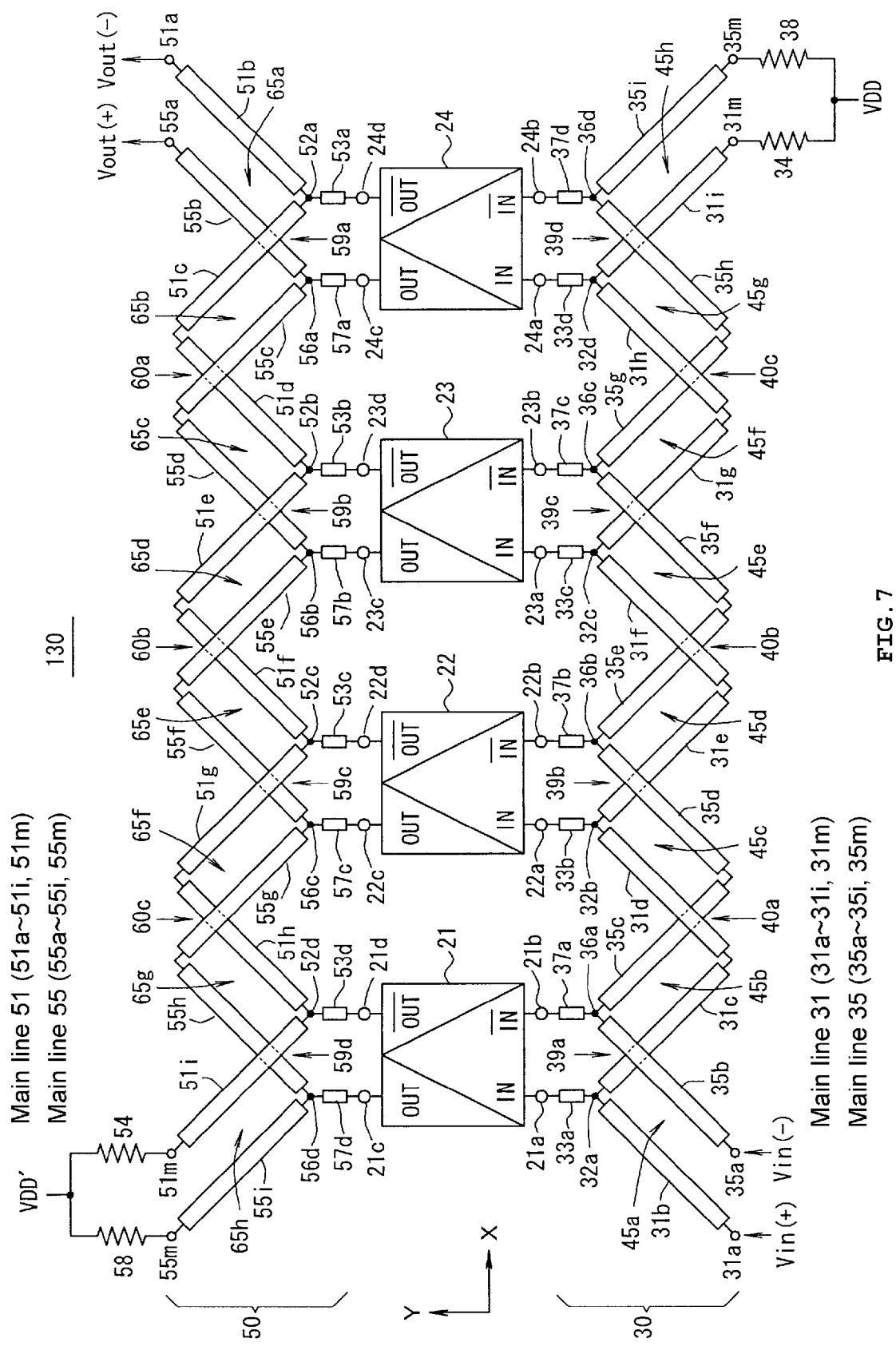
FIG. 7 is a circuit diagram illustrating a differential distributed amplifier which is extended such that the differential signal transmission line shown in FIG. 6 is also used on the output side and is connected to four differential circuits.

FIG. 7 is a circuit diagram illustrating an example of the differential distributed amplifier and shows the structure of a differential distributed amplifier 130 in which the input and output terminals of four differential circuits 21 to 24, which are differential amplifiers with the same structure, are connected to each other by differential signal transmission lines 30 and 50, respectively.

In the differential distributed amplifier 130, the four differential circuits 21 to 24 with the same input/output parasitic capacitance are arranged in a line along the X-axis and the input/output terminals of all of the circuits are arranged in the same direction. In addition, the differential signal transmission line 30 including a pair of main lines 31 and 35 extends in a zigzag in the X-axis direction while the main lines intersect each other at positions that face the differential input terminals of each differential circuit, and is sequentially connected to the differential input terminals of the four differential circuits 21 to 24. The differential signal transmission line 50 including a pair of main lines 51 and 55 extends in a zigzag in the X-axis direction while the main lines intersect each other at positions that face the differential output terminals of each differential circuit, and is sequentially connected to the differential output terminals of the four differential circuits 21 to 24.

The differential signal transmission line 30 shown in FIG. 7 is obtained by extending the differential signal transmission line 30 shown in FIG. 6 to be suitable for four differential circuits. The structure from start terminals 31a and 35a to branch points 32b and 36b of main lines 31 and 35 is the same as that in the differential signal transmission line 30 shown in FIG. 6. One main line 31 includes the branch point 32b, a main line conductor 31e having the same length and slope as the main line conductor 31c, a main line conductor 31f having the same length and slope as the main line conductor 31d, a branch point 32c, a main line conductor 31g having the same length and slope as the main line conductor 31c, a main line conductor 31h having the same length and slope as the main line conductor 31d, a branch point 32d, and a main line conductor 31i that has a slope opposite to the slope of the main line conductor 31*b* and has the same length as the main line conductor 31*b* which are continuously connected, and is terminated at a termination resistor 34 connected to an end terminal 31*m* which is the end of the main line.

Similarly, the other main line 35 includes the branch point 36*b*, a main line conductor 35*e* having the same length and slope as the main line conductor 31*e*, a main line conductor 35*f* having the same length and slope as the main line conductor 35*f*, a branch point 36*c*, a main line conductor 35*g* having the same length and slope as the main line conductor 31*g*, a main line conductor 35*h* having the same length and slope as the main line conductor 31*h*, a branch point 36*d*, and a main line conductor 35*i* having the same length and slope as the main line conductor 31*i* which are continuously connected, and is terminated at a termination resistor 38 connected to an end terminal 35*m* which is the end of the main line.

A pair of branch points 32*a* and 36*a* are connected to differential input terminals 21*a* and 21*b* of the differential circuit 21 through branch lines 33*a* and 37*a*. A pair of branch points 32*b* and 36*b* are connected to differential input terminals 22*a* and 22*b* of the differential circuit 22 through branch lines 33*b* and 37*b*. A pair of branch points 32*c* and 36*c* are connected to differential input terminals 23*a* and 23*b* of the differential circuit 23 through branch lines 33*c* and 37*c*. A pair of branch points 32*d* and 36*d* are connected to differential input terminals 24*a* and 24*b* of the differential circuit 24 through branch lines 33*d* and 37*d*.

In the circuit 130, similarly to the above-mentioned example of the circuit, intersection portions 39*a* to 39*d* which respectively correspond to the differential circuits 21 to 24 are provided in the main lines 31 and 35. The differential input terminal 21*a* is connected to the branch line 33*a* which is provided in the main line 31 close to the differential input terminal 21*a* of the differential circuit 21 in the range from the intersection portion 39*a* to the start terminal on the line. The differential input terminal 21*b* is connected to the branch line 37*a* which is provided in the main line 35 close to the differential input terminal 21*b* of the differential circuit 21 in the range from the intersection portion 39*a* to the end terminal on the line. For the connection between the main lines 31 and 35 and the differential input terminals of the other differential circuits 22 to 24, similarly, the branch lines which are disposed on the start terminal side and the end terminal side of each of the intersection portions 39*b* to 39*d* are connected to a pair of differential input terminals of each of the differential circuits 22 to 24. Therefore, it is possible to equalize the lengths of the pairs of branch lines (33*a*, 37*a*), (33*b*, 37*b*), (33*c*, 37*c*), and (33*d*, 37*d*) for connection to the differential terminals and to reduce the lengths.

In addition, capacitances (the composite capacitances of the equivalent capacitances obtained by the open stub characteristics of the branch lines and the input parasitic capacitances of the differential circuits) added to the branch points can be equal to each other at each branch point, and it is possible to reduce unnecessary equivalent capacitance caused by the open stub characteristics of the branch line.

The pairs of main line conductors {31*b*, 35*b*} to {31*i*, 35*i*} of the pair of main lines 31 and 35 are formed in parallel in the same shape on the same plane and have the same cross-sectional shape, thickness, or width. Therefore, the impedances and inductance components of the pair of main line conductors with respect to the GND plane can be substantially equal to each other. Thus, in the differential signal transmission line 30, the differential signal transmission characteristics without unbalanced phase shifts are obtained. In addition, the branch line is short and unnecessary equivalent capacitance caused by the open stub characteristics is small. As a result, low return loss characteristics are obtained.

In addition, intermediate intersection portions 40*a*, 40*b*, and 40*c* are provided in the main lines between the intersection portions 39*a* to 39*d* which are provided at the positions corresponding to the differential circuits 21 to 24 and the arrangement of positive signal (V(+)) line and negative signal (V(−)) line interchanged at the intersection portions returns to the original state of arrangement at the intermediate intersection portions. Therefore, the polarities of the differential input terminals of each differential circuit are arranged in the same layout.

In the differential signal transmission line 30 using the circuit 130, eight line-surrounded portions 45*a* to 45*h* are formed by the four intersection portions 39*a* to 39*d* and the intermediate intersection portions 40*a* to 40*c* provided between the intersection portions 39*a* to 39*d*. In the above-mentioned structure of the main line conductors, the sum of the areas of the odd-numbered line-surrounded portions 45*a*, 45*c*, 45*e*, and 45*g* from the start terminal is substantially equal to the sum of the areas of the even-numbered line-surrounded portions 45*b*, 45*d*, 45*f*, and 45*h* from the terminal point. Therefore, the influence of external electromagnetic noise which passes through the odd-numbered line-surrounded portions 45*a*, 45*c*, 45*e*, and 45*g* and the influence of external electromagnetic wave noise which passes through the even-numbered line-surrounded portions 45*b*, 45*d*, 45*f*, and 45*h* cancel each other and it is possible to minimize the influence of external electromagnetic noise.

Similarly to the intersection portions 39*a* to 39*d*, in the intermediate intersection portions 40*a*, 40*b*, and 40*c*, a pair of main line conductors intersect at an angle of 90°. Therefore, there is no mutual inductance between the main line conductors and only the capacitance fabricated in the intersection portion may be considered as a factor causing impedance disturbance. The capacitance can be so small as to be negligible since the intersection portions intersect each other, with an insulating layer having a low dielectric constant interposed therebetween.

The differential circuits 21 to 24 to which differential signals are input by the input-side differential signal transmission line 30 having the above-mentioned structure amplify the input signals and output the amplified signals from the pairs of differential output terminals (21*c*, 21*d*), (22*c*, 22*d*), (23*c*, 23*d*), and (24*c*, 24*d*).

The differential output terminals are connected to the output-side differential signal transmission line 50. In the schematic diagram, the output-side differential signal transmission line 50 has a structure obtained by rotating the input-side differential signal transmission line 30 by 180° on the substrate. The signals which have been input from the input-side differential signal transmission line 30 and sequentially amplified by each differential circuit are combined with same phase on the output-side differential signal transmission line 50 and signals Vout(+) and Vout(−), which are the amplified signals of the original input signals Vin(+) and Vin(−), are output from the start terminals 55*a* and 51*a* of the transmission line 50.

As described above, the output-side differential signal transmission line 50 includes a main line 51 with a structure obtained by rotating the main line 31 by 180° and a main line 55 with a structure obtained by rotating the main line 35 by 180°. Therefore, here, only the correspondence relationship between the main lines will be described briefly.

An output terminal 51*a*, which is a start terminal of the main line 51, main line conductors 51*b* to 51*i*, branch points 52*a* to 52*d*, and branch lines 53*a* to 53*d* and the input terminal 31a, the main line conductors 31b to 31i, the branch points 32a to 32d, and the branch lines 33a to 33d of the main line 31 are symmetric with respect to a point. The output terminal 51a, the main line conductors 51b to 51i, the branch points 52a to 52d, and the branch lines 53a to 53d are connected in an order opposite to that in the input-side differential signal transmission line from the differential circuit 24.

That is, a differential output terminal 24d of the differential circuit 24 and the branch point 52a are connected to each other by the branch line 53a. A differential output terminal 23d of the differential circuit 23 and the branch point 52b are connected to each other by the branch line 53b. A differential output terminal 22d of the differential circuit 22 and the branch point 52c are connected to each other by the branch line 53c. A differential output terminal 21d of the differential circuit 21 and the branch point 52d are connected to each other by the branch line 53d. Reference numeral 54 indicates a termination resistor (in this case, a load resistor) connected to the end of the main line conductor 51i which is the end terminal.

Similarly, an output terminal 55a, which is a start terminal of the main line 55, main line conductors 55b to 55i, branch points 56a to 56d, and branch lines 57a to 57d and the input terminal 35a, the main line conductors 35b to 35i, the branch points 36a to 36d, and the branch lines 37a to 37d of the main line 35 are symmetric with respect to a point. The output terminal 55a, the main line conductors 55b to 55i, the branch points 56a to 56d, and the branch lines 57a to 57d are connected in an order opposite to that in the input-side differential signal transmission line from the differential circuit 24.

That is, a differential output terminal 24c of the differential circuit 24 and the branch point 56a are connected to each other by the branch line 57a. A differential output terminal 23c of the differential circuit 23 and the branch point 56b are connected to each other by the branch line 57b. A differential output terminal 22c of the differential circuit 22 and the branch point 56c are connected to each other by the branch line 57c. A differential output terminal 21c of the differential circuit 21 and the branch point 56d are connected to each other by the branch line 57d. Reference numeral 58 indicates a termination resistor (in this case, a load resistor) connected to the end of the main line conductor 55i which is the end terminal.

In the output-side differential signal transmission line 50, similarly to the input-side differential signal transmission line, intersection portions 59a to 59d corresponding to the differential circuits 21 to 24 are provided in the main lines 51 and 55 and portions of the transmission line which are disposed on the start terminal side and the end terminal side of each intersection portion are connected to a pair of differential output terminals of each of the differential circuits 21 to 24. Therefore, it is possible to equalize the lengths of the pairs of branch lines (53a, 57a), (53b, 57b), (53c, 57c), and (53d, 57d) for connection to the differential terminals and to reduce the lengths.

In addition, capacitances (the composite capacitances of the equivalent capacitances obtained by the open stub characteristics of the branch lines and the input capacitances of the differential circuits) added to the branch points can be equal to each other at each branch point, and it is possible to reduce unnecessary equivalent capacitance obtained by the open stub characteristics of the branch line.

The pairs of main line conductors {51b, 55b} to {51i, 55i} of the pair of main lines 51 and 55 are formed in parallel in the same shape on the same plane and have the same cross-sectional shape, thickness, or width. Therefore, the characteristic impedances and inductance components of positive signal (V(+)) line and negative signal (V(−)) line conductor with respect to the GND plane can be substantially equal to each other. Thus, in the differential signal transmission line 50, the differential signal transmission characteristics without unbalanced phase shifts are obtained. In addition, the branch line is short and unnecessary equivalent capacitance caused by the open stub characteristics is small. As a result, low return loss characteristics are obtained.

In addition, intermediate intersection portions 60a, 60b, and 60c are provided in the main lines between the intersection portions 59a to 59d which are provided at the positions corresponding to the differential circuits 21 to 24 and the arrangement of the positive signal (V(+)) line and negative signal (V(−)) line interchanged at the intersection points returns to the original state of arrangement at the intermediate intersection portions. Therefore, the polarities of the differential input terminals of each differential circuit are arranged in the same layout and the output-side circuit structure and layout pattern can be uniform.

Similarly to the input-side line, in the differential signal transmission line 50, eight line-surrounded portions 65a to 65h are formed by four intersection portions 59a to 59d and intermediate intersection portions 60a to 60c which are provided between the intersection portions 59a to 59d. In the above-mentioned structure of the main line conductors, the sum of the areas of the odd-numbered line-surrounded portions 65a, 65c, 65e, and 65g from the start terminal is substantially equal to the sum of the areas of the even-numbered line-surrounded portions 65b, 65d, 65f, and 65h from the start terminal. Therefore, the influence of external electromagnetic noise which passes through the odd-numbered line-surrounded portions 65a, 65c, 65e, and 65g and the influence of external electromagnetic noise which passes through the even-numbered line-surrounded portions 65b, 65d, 65f, and 65h cancel each other and it is possible to minimize the influence of external electromagnetic noise.

Similarly to the intersection portions 59a to 59d, in the intermediate intersection portions 60a to 60c, a pair of main line conductors intersect at an angle of 90°. Therefore, there is no mutual inductance between the main line conductors and only the capacitance fabricated in the intersection portion may be considered as a factor causing impedance disturbance. The capacitance can be so small as to be negligible since the intersection portions intersect each other, with an insulating layer having a low dielectric constant interposed therebetween.

In the differential distributed amplifier 130 having the above-mentioned structure, the electrical lengths of the differential signal transmission lines 30 and 50 are optimized such that signals input to the start terminals of the differential signal transmission line 30 are sequentially amplified by the differential circuits 21 to 24 while being propagated to the end terminals and the amplified output signals with the same phase are combined with each other while being propagated to the start terminals of the differential signal transmission line 50.

In a regular structure in which the angle of each main line conductor forming the main line with respect to the X-axis is 45°, all of the main line conductors have the same length, the conductors have the same width and thickness, and the distance between the lines is the same, the main line conductors can have the same characteristic impedance or inductance component. In addition, when the branch lines 33a to 33d and 37a to 37d of the input-side line and the branch lines 53a to 53d and 57a to 57a of the output-side line have the same shape and the input parasitic capacitance and the output parasitic capacitance of the differential circuits 21 to 24 are equal to each other, the capacitances added to the branch points (32*a* to 32*d*, 36*a* to 36*d*) and (52*a* to 52*d*, 56*a* to 56*d*) are equal to each other and the differential signal transmission lines 30 and 50 can have the same transmission characteristics. That is, the electrical length between the branch points of the main lines is the same in the input-side line and the output-side line. Therefore, the signals which have been input from the input-side differential signal transmission line 30, amplified, and then output from the differential circuits 21 to 24 are combined with same phase by the output-side differential signal transmission line 50. As a result, a high gain is obtained.

When the input parasitic capacitance and the output parasitic capacitance of the differential circuits 21 to 24 are different from each other, a general method may be used in which a parallel-plate capacitor which is formed on a semiconductor substrate is added to the input or output terminals of the differential circuits 21 to 24 to adjust the input parasitic capacitance and the output parasitic capacitance to the same value.

Figure 8:
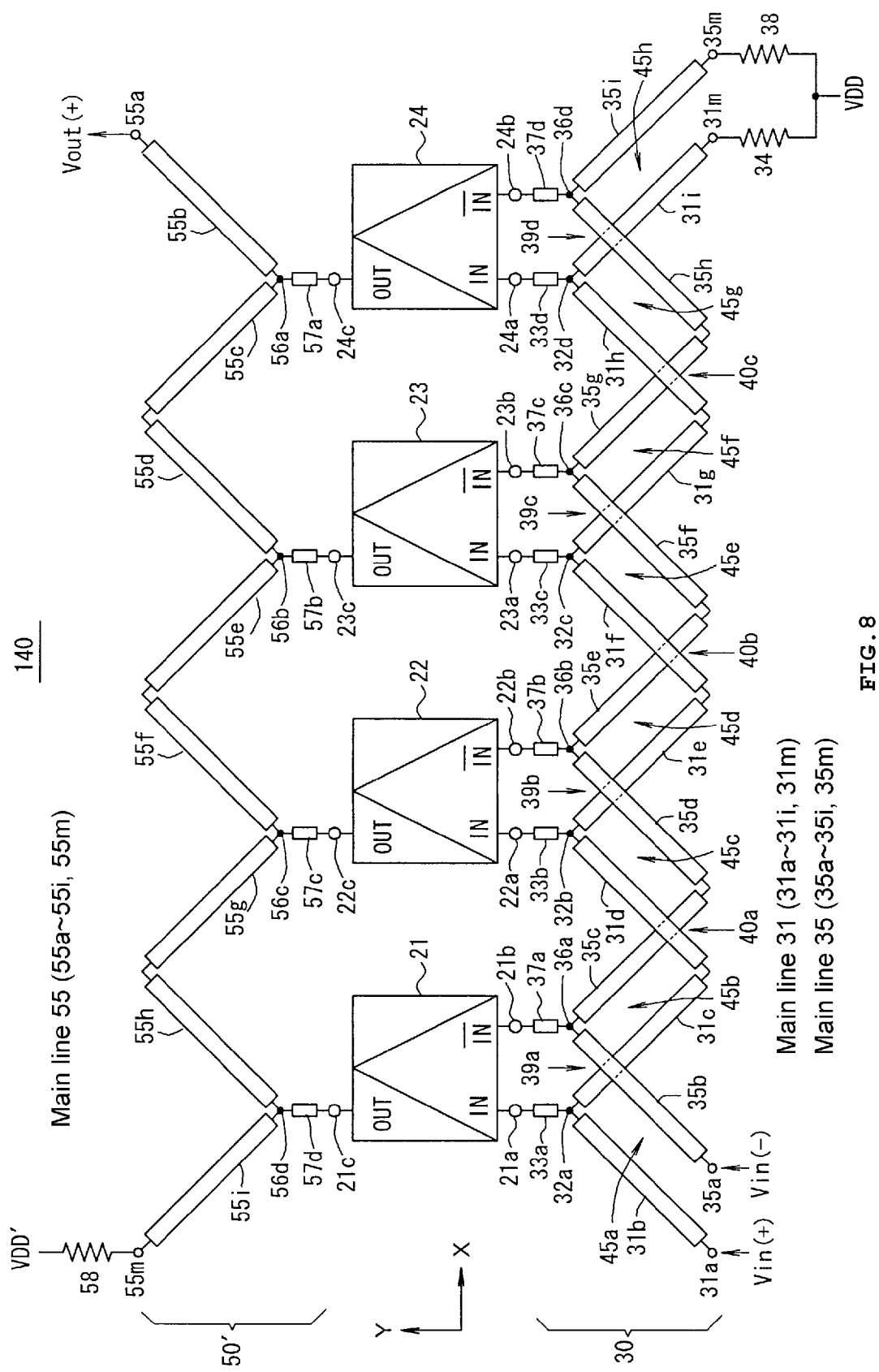
FIG. 8 is a circuit diagram illustrating a single-phase output-side line of the differential distributed amplifier shown in FIG. 7.

A differential distributed amplifier 140 shown in FIG. 8 has a differential input-single output structure in which a single transmission line 50' that combines output signals from output terminals 21*c* to 24*c* of differential circuits 21 to 24 with same phase is used, instead of the differential signal transmission line 50 shown in FIG. 7.

Simulation analysis was performed for the differential signal transmission line 30 connected to the input of the differential distributed amplifier 140.

The simulation conditions were as follows: a substrate material was InP and had a dielectric constant of 12.4; the thickness of a substrate was 100 μm; the thickness of an insulating layer in an intersection portion was 1 μm; the thickness of branch lines and main line conductors formed on the surface of the substrate was 1 μm; the thickness of main line conductors formed on the substrate for intersection was 0.5 μm; main line conductors 31*b* to 31*i* and 35*b* to 35*i* had a width of 6 μm, an inter-line distance of 70 μm, a characteristic impedance of 90Ω, and a line length of 120 μm; branch lines 33 and 37 had a width of 5 μm and a length of 10 μm; circuit input parasitic capacitance was a value of 14 fF; and the characteristic impedance of an artificial transmission line by the parasitic capacitance and the inductance component of the line was set to 70Ω. In addition, termination resistors 34 and 38 had a resistance value of 70Ω.

Figure 9:
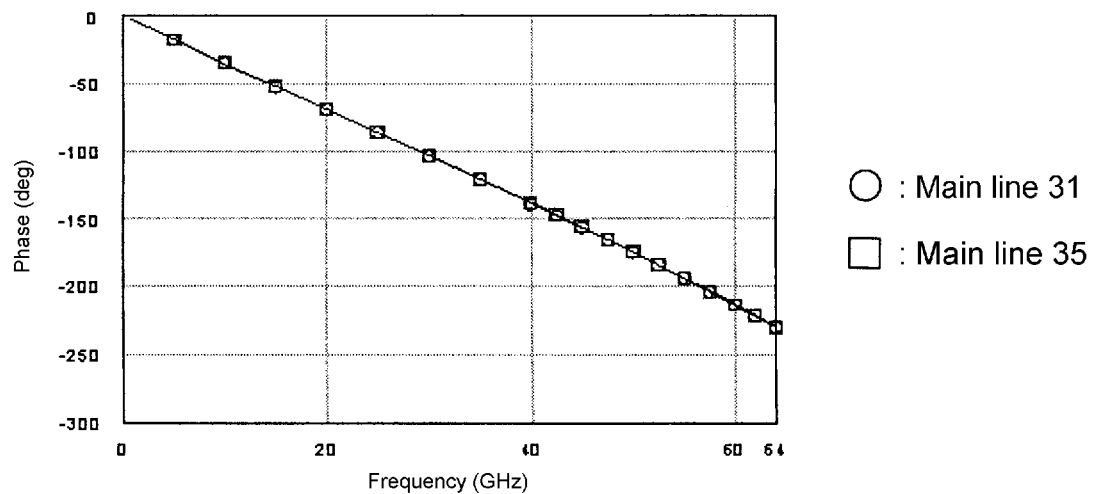
FIG. 9 is a diagram illustrating the simulation result of the circuit shown in FIG. 8.
Figure 10:
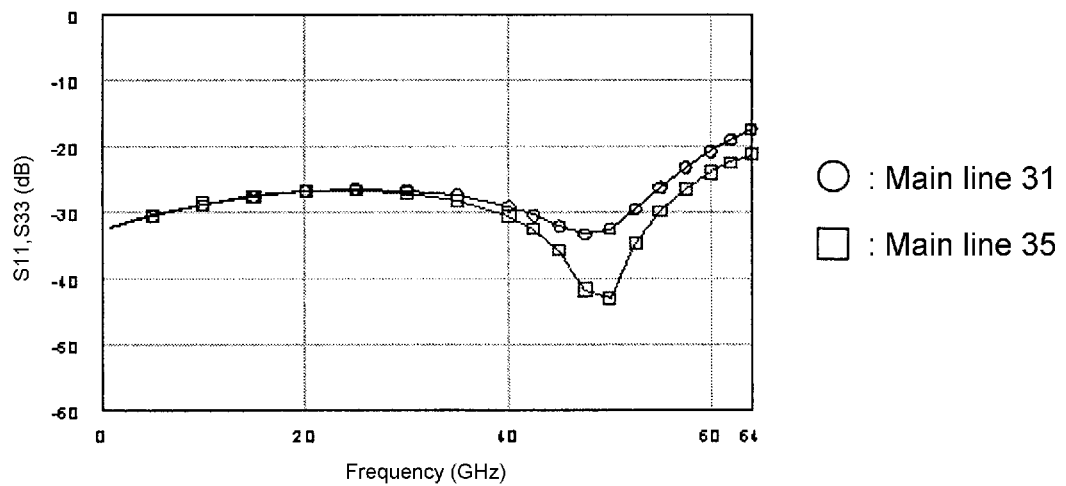
FIG. 10 is a diagram illustrating the simulation result of the circuit shown in FIG. 8.
Figure 19:
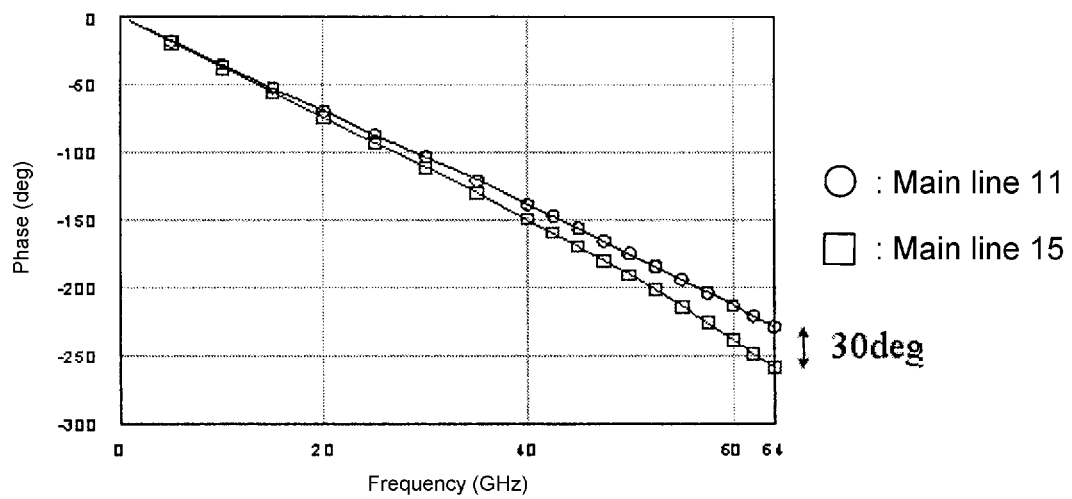
FIG. 19 is a diagram illustrating the simulation result of the circuit shown in FIG. 18.
Figure 20:
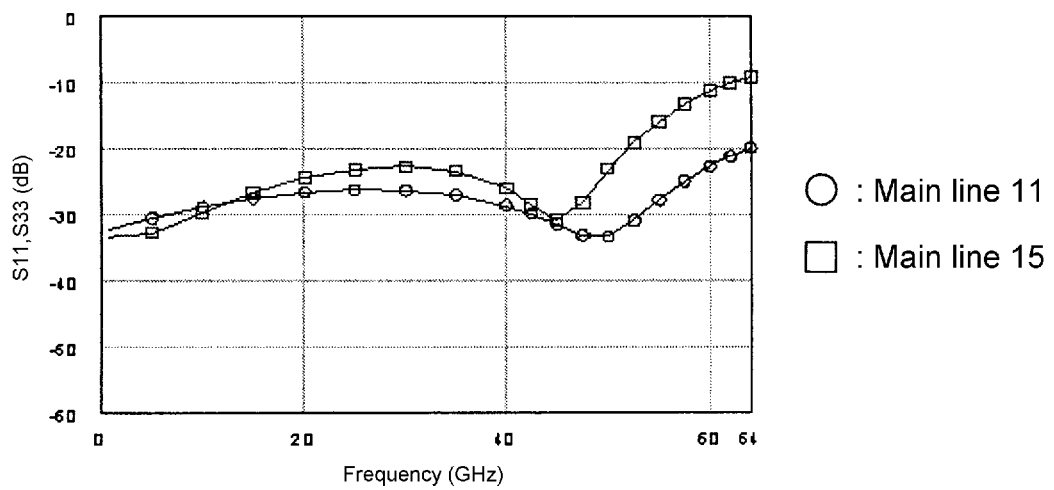
FIG. 20 is a diagram illustrating the simulation result of the circuit shown in FIG. 18.

The transmission phase characteristics of the main line from the start terminal to the end terminal were calculated under these conditions and the calculation results are shown in FIG. 9. As can be seen from comparison between FIG. 9 and FIG. 19, the phase shifts are equal between the main lines. In addition, FIG. 10 shows the return loss of two main lines. As can be seen from FIG. 10, a return loss of −15 dB or less is obtained in the frequency range up to 64 GHz and is significantly improved as compared with FIG. 20.

When the differential signal transmission line 30 shown in FIG. 8 is used, it is possible to equalize the lengths of a pair of branch lines for connection to the differential input terminals and to reduce the lengths. In addition, it is possible to reduce and balance the equivalent capacitance obtained by the open stub characteristics of the branch lines added to a pair of main lines. Therefore, characteristics without unbalanced phase shifts or deterioration of return loss are obtained.

Figure 11:
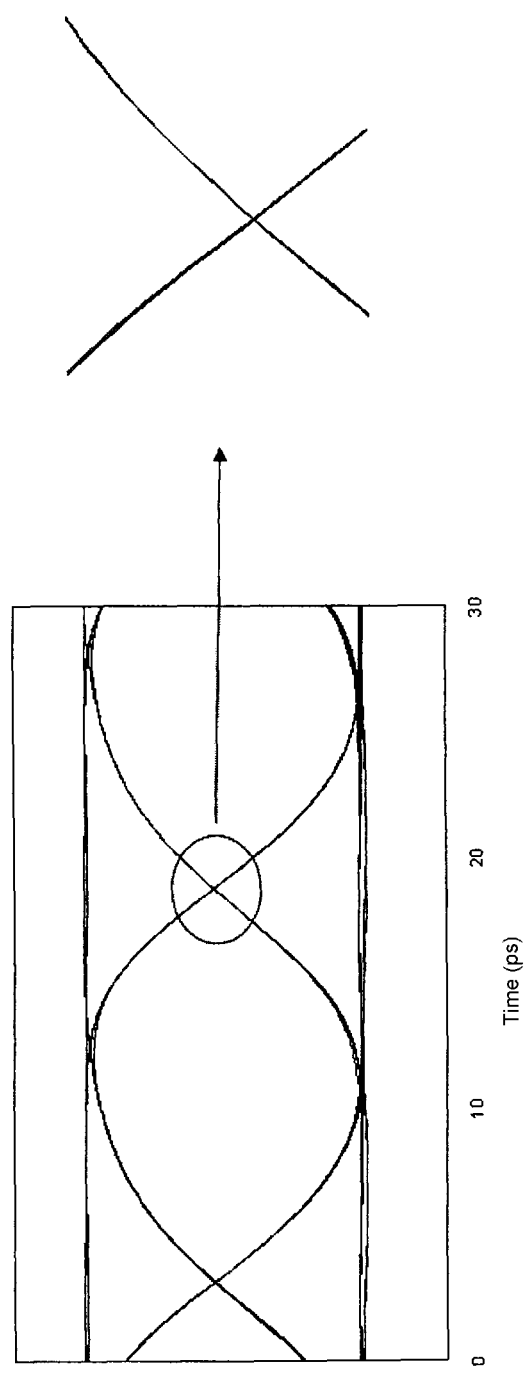
FIG. 11 is a diagram illustrating the output waveform of the circuit shown in FIG. 8.
Figure 21:
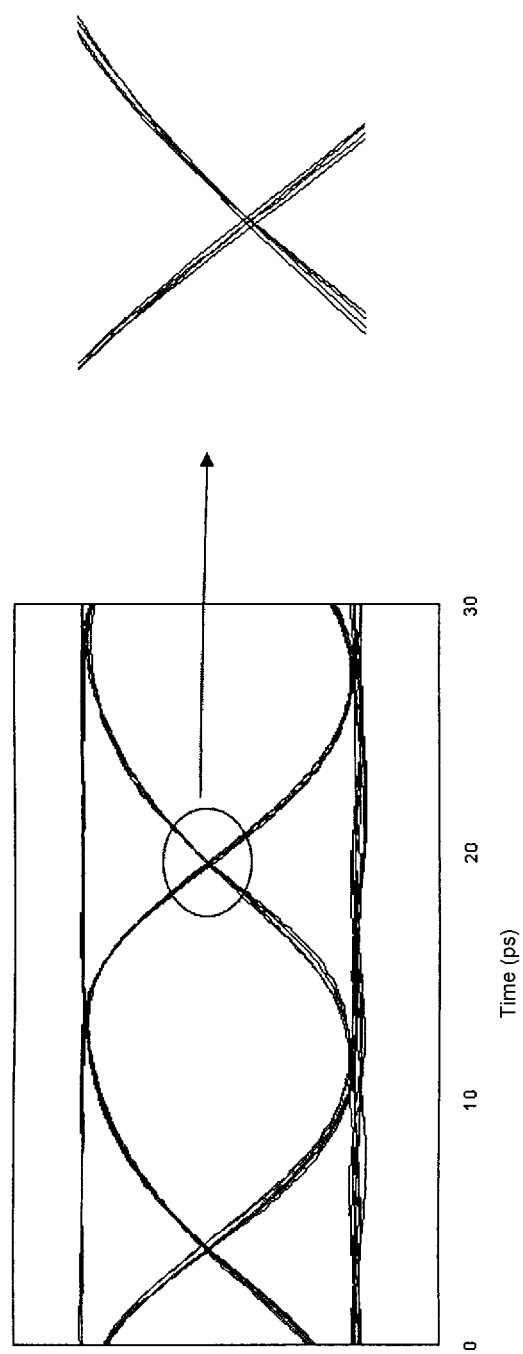
FIG. 21 is a diagram illustrating the output waveform of the circuit shown in FIG. 18.

FIG. 11 shows the output waveform of a 64-Gbps NRZ signal. As can be seen from FIG. 11, jitter or baseline noise is reduced and waveform quality is significantly improved, as compared to the output waveform of the conventional circuit shown in FIG. 21.

In the description of the above-mentioned examples, the branch points which are provided front and back the intersection portions of the main lines are connected to the differential terminals of the differential circuit through the branch lines with a predetermined length. However, the branch line may also function as the differential terminal (the length of the branch line=0), that is, the differential terminal of the differential circuit may be directly connected to the main line. In this case, it is possible to connect the main line, without branch line and neglect the influence of the branch line. Therefore, it is easy to design a circuit.

Figure 12:
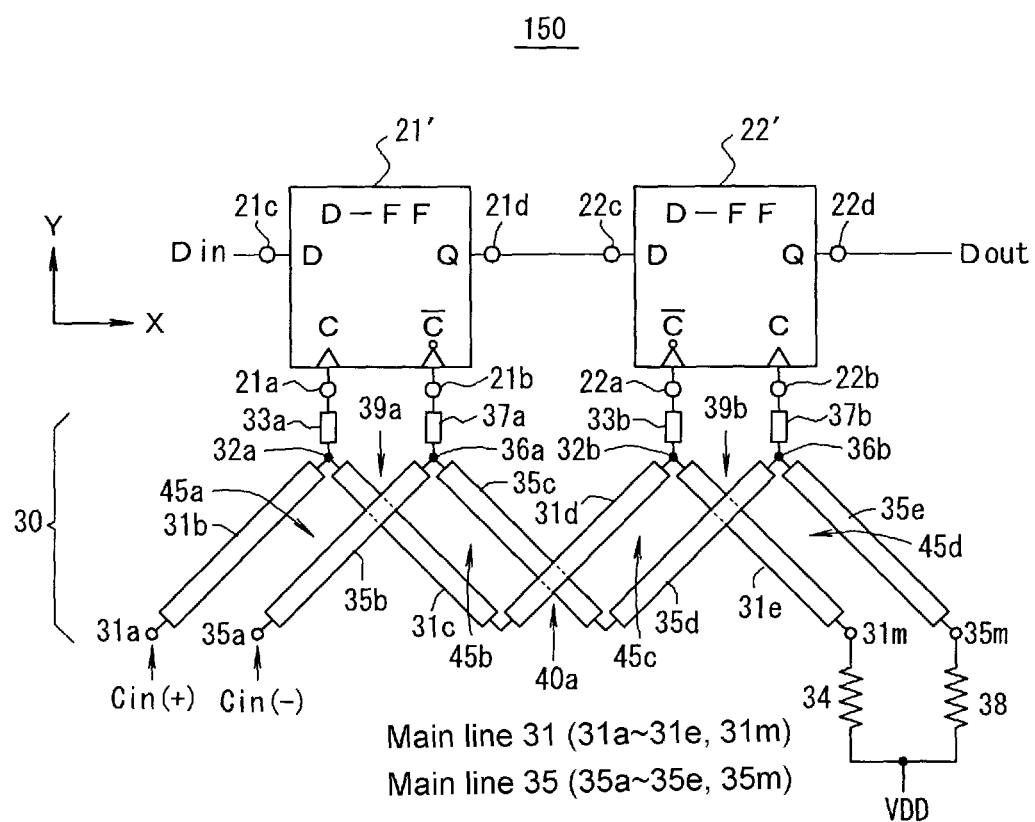
FIG. 12 is a circuit diagram illustrating a structure in which differential clock signals are input to two latch circuits through the differential signal transmission line shown in FIG. 6.

The differential signal transmission line 30 can be used as, for example, a clock input line of a master-slave flip-flop circuit 150 including latch circuits 21' and 22' which are connected in series, as shown in FIG. 12, in addition to the differential amplifier shown in FIG. 6.

In the circuit 150, non-inverted clock signals Cin(+) and Cin(−) need to be input to the master latch circuit (D-FF) 21' and inverted clock signal Cin(−) and Cin(+) need to be input to the slave latch circuit 22'. Since the two latch circuits 21' and 22' are arranged on one side of a pair of main lines 31 and 35 in order for data line connection, the clock input terminals 22*a* and 22*b* of the slave latch circuit 22' is inverted to the polarity of clock input terminals 21*a* and 21*b* of the master latch circuit 21'.

In the above-mentioned examples, a pair of differential terminals of each of a plurality of differential circuits which are connected to each other through the differential signal transmission line are uniformly used as differential input terminals for inputting signals or differential output terminals for outputting signals. However, a pair of differential input terminals for inputting signals and a pair of differential output terminals for outputting signals may be used as the pair of differential terminals of each of the plurality of differential circuits which are connected to each other through the differential signal transmission line.

Figure 13:
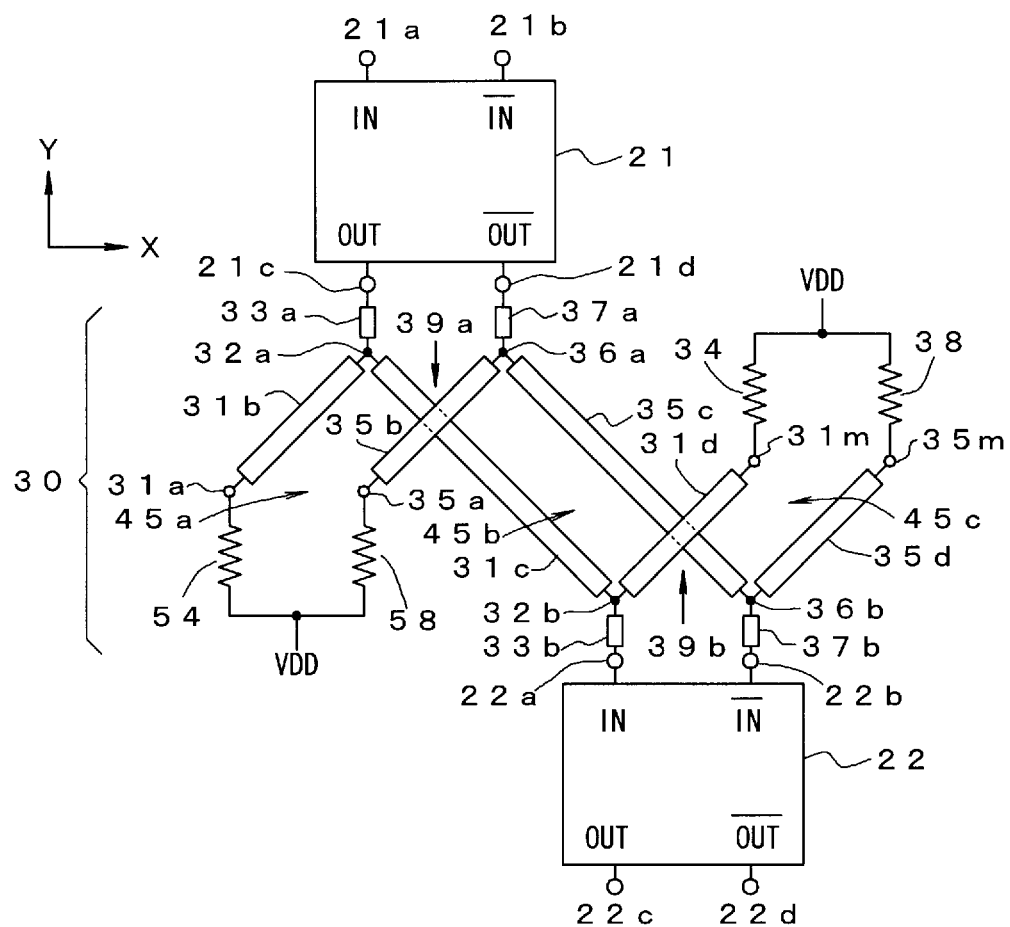
FIG. 13 is a diagram illustrating a minimum-size structure when the differential signal transmission line according to the embodiment is used to connect differential output terminals and differential input terminals of circuits which are arranged on both sides of the line.

A circuit 160 shown in FIG. 13 is an example of the above-mentioned structure. In the circuit 160, two differential circuits 21 and 22 are arranged so as to be diagonally opposite to each other, with a differential signal transmission line 30 interposed therebetween, differential output terminals 21*c* and 21*d* of the differential circuit 21 and differential input terminals 22*a* and 22*b* of the differential circuit 22 are connected to the differential signal transmission line 30.

Figure 14:
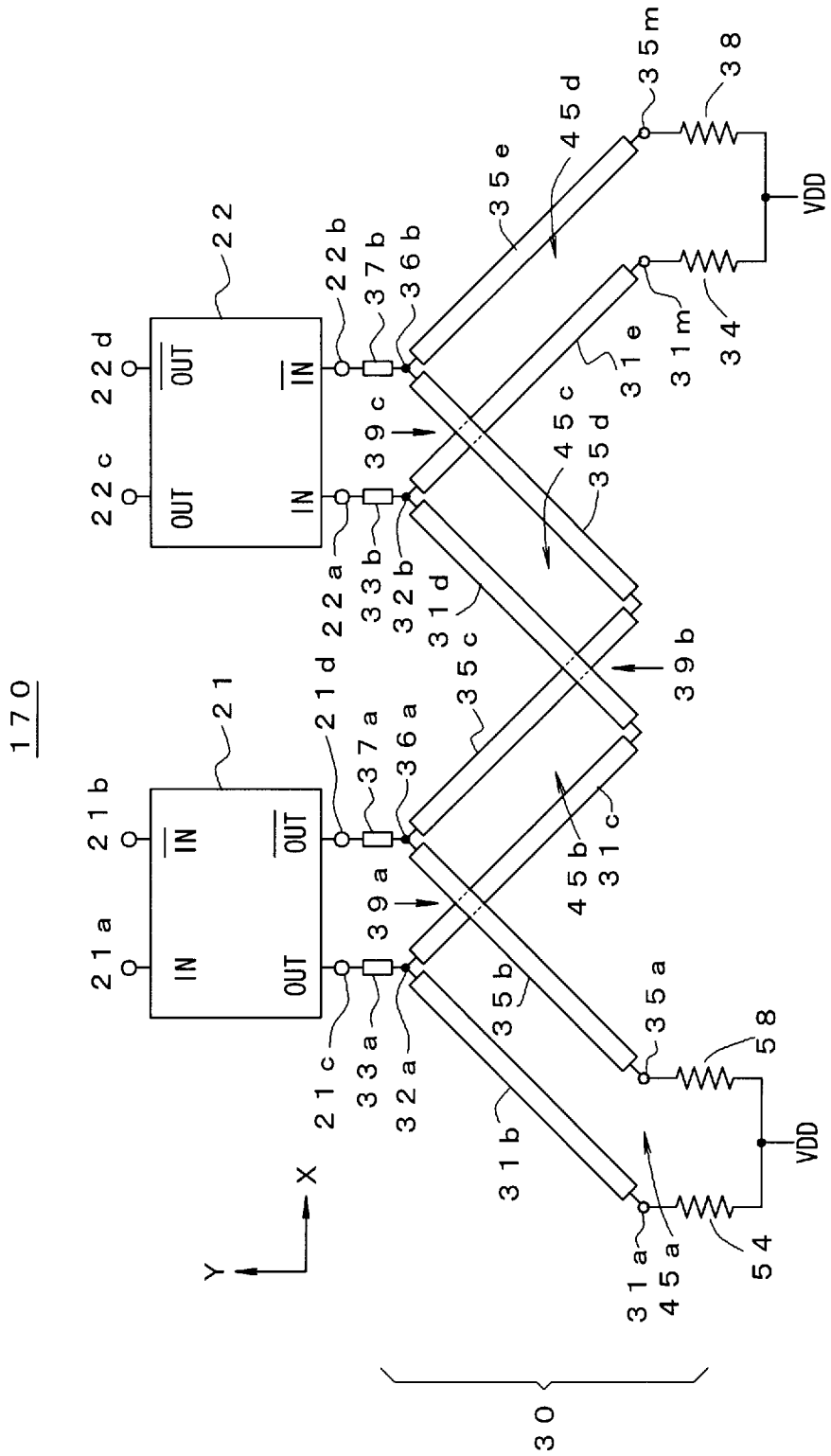
FIG. 14 is a diagram illustrating a minimum-size structure when the differential signal transmission line according to the embodiment is used to connect differential output terminals and differential input terminals of circuits which are arranged on one sides of the line.

A circuit 170 shown in FIG. 14 has a structure in which two differential circuits 21 and 22 are arranged on one side of a differential signal transmission line 30. In the circuit 170, similarly to the circuit 160 shown in FIG. 13, a pair of differential output terminals 21*c* and 21*d* of the differential circuit 21 are connected to a pair of differential input terminals 22*a* and 22*b* of the differential circuit 22 through the differential signal transmission line 30.

In the circuits 160 and 170, the output signal from the differential circuit 21 is transmitted to the differential circuit 22. The signal output from the differential circuit 21 is propagated to output ends (start terminals) 31*m* and 35*m* through the differential signal transmission line 30, is input to the differential circuit 22, and is then absorbed by load resistors 34 and 38 which are output ends. In addition, termination resistors 54 and 58 are connected to the other output ends (end terminals) 31*a* and 35*a* and absorb the signal which is output from the differential circuit 21 and is propagated in a direction opposite to the above-mentioned direction.

In the structure, a broadband artificial transmission line is formed by the inductance component of the differential signal transmission line 30, and the output parasitic capacitance of the differential circuit 21 and the input parasitic capacitance of the differential circuit 22, and the end of the differential signal transmission line 30 is terminated by the resistor which is matched with the characteristic impedance of the artificial transmission line. Therefore, broadband transmission characteristics are obtained.

In the structures shown in FIGS. 13 and 14, two differential circuits are provided. However, a plurality of sets of the structures shown in FIGS. 13 and 14 may be continuously connected. In addition, in the structures shown in FIGS. 13 and 14, a pair of differential input terminals of a differential circuit following the differential circuit 22 may be connected.

In the above-mentioned examples, the main line conductors forming the main lines are formed in a straight shape and are inclined at an angle of ±45° with respect to the direction (X-axis direction). However, the invention is not limited thereto, but the length or slope of the main lines between the intersection portions or the intermediate intersection portions may be arbitrarily changed within the range in which transmission characteristics do not deteriorate.

Figure 15:
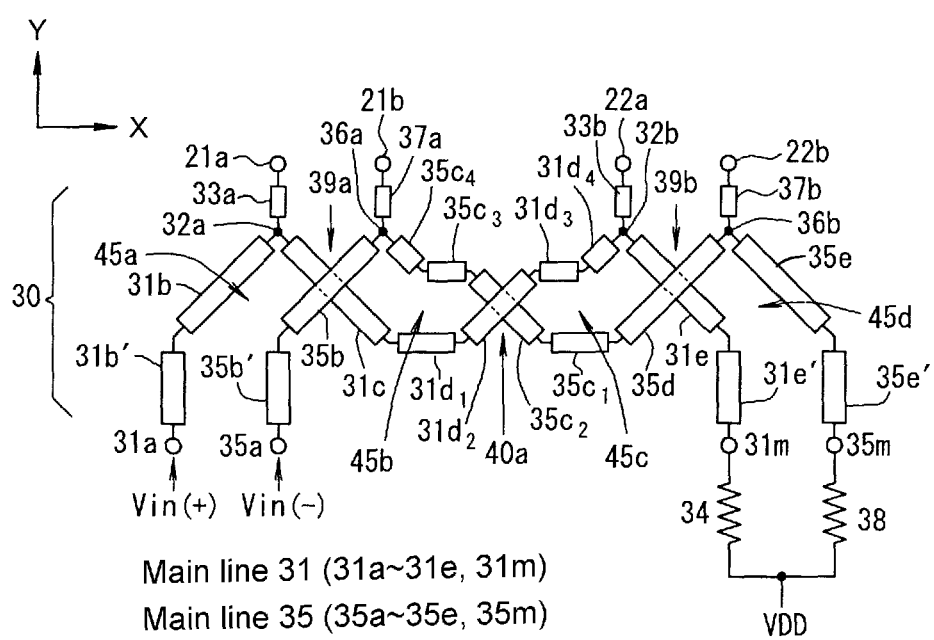
FIG. 15 is a diagram illustrating a modification of the differential signal transmission line according to the invention.

An example of the modification is shown in FIG. 15. In a differential signal transmission line 30 shown in FIG. 15, instead of the main line conductor 31d shown in FIG. 6, the following main line conductors are used: a main line conductor $31d_1$ which extends from the end of the main line conductor 31c along the X-axis; a main line conductor $31d_2$ which extends from the leading end of the main line conductor $31d_1$ to the branch point 32b at an angle of 45° with respect to the X-axis; a main line conductor $31d_3$ that extends from the leading end of the main line conductor $31d_2$ along the X-axis; and a main line conductor $31d_4$ which extends from the leading end of the main line conductor $31d_3$ to the branch point 32b at an angle of 45° with respect to the X-axis.

In the main line 35 which is axial symmetric (Y-axis) to the main line 31, instead of the main line conductor 35c shown in FIG. 6, the following main line conductors are used: a main line conductor $35c_1$ which extends from the end of the main line conductor 35d along the X-axis; a main line conductor $35c_2$ which extends from the leading end of the main line conductor $35c_1$ to the branch point 36a at an angle of 45° with respect to the X-axis; a main line conductor $35c_3$ that extends from the leading end of the main line conductor $35c_2$ along the X-axis; and a main line conductor $35c_4$ which extends from the leading end of the main line conductor $35c_3$ to the branch point 36a at an angle of 45° with respect to the X-axis. The main line conductor $31d_2$ and the main line conductor $35c_2$ intersect at an angle of 90° to form an intermediate intersection portion 40a.

In the structure shown in FIG. 15, it is possible to adjust the length of the line to be shorter than that in the structure shown in FIG. 6. Therefore, when the relationship between the electrical lengths of the input and output lines is not optimal due to the difference between the input parasitic capacitance and the output parasitic capacitance of the differential circuit to be connected or because the output line is thicker than the input line due to restrictions in current capacity and the characteristic impedance of the output line is less than the input line, the length of the line can be physically changed to adjust the electrical length. Therefore, it is possible to optimize the relationship between the electrical lengths of the input and output lines.

As shown in FIG. 15, when main line conductors 31b', 35b', 31e', and 35e' which are parallel to the Y-axis are connected to the ends of the main line conductors 31b and 35b and the main line conductors 31e and 35e, it is possible to easily adjust the position of the front-stage circuit which output signals Vin(+) and Vin(−) or the termination resistors.

As described above, the length or slope of the main lines between the intersection portions or the intermediate intersection portions can be arbitrarily changed within the range in which transmission characteristics do not deteriorate. As shown in FIG. 15, the intermediate intersection portion 40a does not need to locate at the middle of intersection portion 39a and 39b. The intermediate intersection portion may locate at the position which leans to one of the two intersection portions.

In the above-described embodiments, connection portions between the main line conductors with a straight shape are represented by lines. However, this is simply a display method for distinguishing the main line conductors. In practice, the connection portions between the main line conductors are formed on the substrate such that the angles thereof are changed while their widths are maintained, in order to prevent the deterioration of the characteristics of the line. In addition, the circumference of the portion whose angle is changed may be smoothly curved.

Among the examples of the circuits, one of the two differential circuits 21 and 22 corresponds to the 'first differential circuit' according to the invention and the other differential circuit corresponds to the 'second differential circuit' according to the invention. In the circuit using the four differential circuits 21 to 24, it is considered that each differential circuit is the 'first differential circuit' or the 'second differential circuit'. However, as described above, the invention can also be applied to the structure in which other differential circuits are connected between the main differential circuits corresponding to the 'first differential circuit' and the 'second differential circuit' and to the start terminals and the end terminals by a connection method different from that according to the invention.

DESCRIPTION OF REFERENCE NUMERALS AND SIGNS

21 to 24: DIFFERENTIAL CIRCUIT
21a to 24a, 21b to 24b: DIFFERENTIAL INPUT TERMINAL
21c to 24c, 21d to 24d: DIFFERENTIAL OUTPUT TERMINAL
30, 50: DIFFERENTIAL SIGNAL TRANSMISSION LINE
31, 35, 51, 55: MAIN LINE
31a, 35a, 51a, 55a: START TERMINAL
31b to 31i, 35b to 35i, 51b to 51i, 55b to 55i: MAIN LINE CONDUCTOR
32a to 32d, 36a to 36d, 52a to 52d, 56a to 56d: BRANCH POINT
31m, 35m, 51m, 55m: END TERMINAL
33a to 33d, 37a to 37d, 53a to 53d, 57a to 57d: BRANCH LINE
34, 38, 54, 58: TERMINATION RESISTOR
39a to 39d, 59a to 59d: INTERSECTION PORTION
40a to 40c, 60a to 60c: INTERMEDIATE INTERSECTION PORTION
45a to 45h, 65a to 65h: LINE-SURROUNDED PORTION

The invention claimed is:

1. A differential signal transmission line (30,50) that transmits and receives differential signals to and from a pair of differential terminals of each of a plurality of differential circuits (21,22,23,24) which are formed on the side of a pair of main lines on a substrate, comprising:
   the pair of main lines (31,35,51,55) that are conductors formed on the substrate and propagate the differential signals;

start terminals (31*a*,35*a*,51*a*,55*a*) that are one ends of the main lines to or from which the differential signals are input or output;

end terminals (31*m*,35*m*,51*m*,55*m*) that are the other ends of the main lines;

termination circuits (34,38,54,58) that are connected to the end terminals;

a first intersection portion (39*a*,39*c*,59*d*,59*b*) arranged on the side of a first differential circuit (21,23) among the plurality of differential circuits and in which the conductors of the pair of main lines intersect each other, with a first insulating portion comprising an insulating layer interposed therebetween;

a first branch line (33*a*,33*c*,53*d*,53*b*) that is provided between the first intersection portion and the start terminal on one of the pair of main lines which has a point closest in distance to one differential terminal of the first differential circuit in a range from the first intersection portion to the start terminal and is connected to the one differential terminal of the first differential circuit;

a second branch line (37*a*,37*c*,57*d*,57*b*) that is provided between the first intersection portion and the end terminal on the other of the pair of main lines which has a point closest in distance to the other differential terminal of the first differential circuit in a range from the first intersection portion to the end terminal and is connected to the other differential terminal of the first differential circuit;

a second intersection portion (39*b*,39*d*,59*c*,59*a*) arranged on the side of a second differential circuit (22,24) different from the first differential circuit among the plurality of differential circuits and in which the conductors of the pair of main lines intersect each other, with a second insulating portion comprising an insulating layer interposed therebetween;

a third branch line (33*b*,33*d*,53*c*,53*a*) that is provided between the second intersection portion and the start terminal on one of the pair of main lines which has a point closest in distance to one differential terminal of the second differential circuit in a range from the second intersection portion to the start terminal and is connected to the one differential terminal of the second differential circuit; and a fourth branch line (37*b*,37*d*,57*c*,57*a*) that is provided between the second intersection portion and the end terminal on the other of the pair of main lines which has a point closest in distance to the other differential terminal of the second differential circuit in a range from the second intersection portion to the end terminal and is connected to the other differential terminal of the second differential circuit.

2. The differential signal transmission line according to claim 1, wherein the first differential circuit is arranged on one side of the pair of main lines, the second differential circuit is arranged on the other side of the pair of main lines, and the conductors of the pair of main lines are connected so as not to intersect each other between the first intersection portion and the second intersection portion.

3. The differential signal transmission line according to claim 2, wherein a pair of signal input differential terminals of the first differential circuit are connected to a pair of signal input differential terminals of the second differential circuit.

4. The differential signal transmission line according to claim 2, wherein a pair of signal output differential terminals of the first differential circuit are connected to a pair of signal output differential terminals of the second differential circuit.

5. The differential signal transmission line according to claim 2, wherein a pair of signal output differential terminals of the first differential circuit are connected to a pair of signal input differential terminals of the second differential circuit.

6. The differential signal transmission line according to claim 2, wherein the pair of main lines are formed such that, among a plurality of line-surrounded portions (45*a*-45*h*,65*a*-65*h*) which are partitioned by the first and second intersection portions (39*a*-39*d*) in a region surrounded by the pair of main lines, the sum of the areas of the odd-numbered line-surrounded portions from the start terminal is equal to the sum of the areas of the even-numbered line-surrounded portions from the start terminal.

7. The differential signal transmission line according to claim 2, wherein the first and second branch lines or the third and fourth branch lines also serve as a pair of differential terminals of the differential circuit.

8. The differential signal transmission line according to claim 1, wherein the first differential circuit and the second differential circuit are arranged on one side of the pair of main lines, and an intermediate intersection portion (40*a*-40*c*,60*a*-60*c*) in which the conductors of the pair of main lines intersect each other with an intermediate intersection insulating portion comprising an insulating layer interposed therebetween is provided between the first intersection portion and the second intersection portion.

9. The differential signal transmission line according to claim 8, wherein a pair of signal input differential terminals of the first differential circuit are connected to a pair of signal input differential terminals of the second differential circuit.

10. The differential signal transmission line according to claim 8, wherein a pair of signal output differential terminals of the first differential circuit are connected to a pair of signal output differential terminals of the second differential circuit.

11. The differential signal transmission line according to claim 8, wherein a pair of signal output differential terminals of the first differential circuit are connected to a pair of signal input differential terminals of the second differential circuit.

12. The differential signal transmission line according to claim 8, wherein the pair of main lines are formed such that, among a plurality of line-surrounded portions (45*a*-45*h*,65*a*-65*h*) which are partitioned by the first and second intersection portions and the intermediate intersection portion (40*a*-40*c*) provided between the first and second intersection portions in a region surrounded by the pair of main lines, the sum of the areas of the odd-numbered line-surrounded portions from the start terminal is equal to the sum of the areas of the even-numbered line-surrounded portions from the start terminal.

13. The differential signal transmission line according to claim 8, wherein the first and second branch lines or the third and fourth branch lines also serve as a pair of differential terminals of the differential circuit.

14. The differential signal transmission line according to claim 1, wherein a pair of signal input differential terminals of the first differential circuit are connected to a pair of signal input differential terminals of the second differential circuit.

15. The differential signal transmission line according to claim 1, wherein a pair of signal output differential terminals of the first differential circuit are connected to a pair of signal output differential terminals of the second differential circuit.

16. The differential signal transmission line according to claim 1, wherein a pair of signal output differential terminals of the first differential circuit are connected to a pair of signal input differential terminals of the second differential circuit.

17. The differential signal transmission line according to claim 1, wherein the pair of main lines are formed such that, among a plurality of line-surrounded portions (45*a*-45*h*,65*a*-65*h*) which are partitioned by the first and second intersection portions (39*a*-39*d*) or the first and second intersection portions and the intermediate intersection portion (40*a*-40*c*) provided between the first and second intersection portions in a region surrounded by the pair of main lines, the sum of the areas of the odd-numbered line-surrounded portions from the start terminal is equal to the sum of the areas of the even-numbered line-surrounded portions from the start terminal.

18. The differential signal transmission line according to claim 1, wherein the first and second branch lines or the third and fourth branch lines also serve as a pair of differential terminals of the differential circuit.

19. The differential signal transmission line according to claim 1, wherein differential signal transmission line is a balanced line type in which the pair of main lines are electromagnetically coupled each other, a micro strip type in which a reference conductor facing the pair of main lines, a coplanar type in which a reference conductor formed on the side of the pair of main lines, or a combination thereof.

\* \* \* \* \*